(12) United States Patent
Kanskar

(10) Patent No.: US 10,186,836 B2
(45) Date of Patent: Jan. 22, 2019

(54) MULTIPLE FLARED LASER OSCILLATOR WAVEGUIDE

(71) Applicant: nLIGHT Photonics Corporation, Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 226 days.

(21) Appl. No.: 14/879,515

(22) Filed: Oct. 9, 2015

(65) Prior Publication Data

US 2016/0104997 A1    Apr. 14, 2016

Related U.S. Application Data

(60) Provisional application No. 62/062,146, filed on Oct. 10, 2014.

(51) Int. Cl.
*H01S 5/10* (2006.01)
*H01S 5/20* (2006.01)
(Continued)

(52) U.S. Cl.
CPC .......... *H01S 5/1014* (2013.01); *H01S 5/2018* (2013.01); *H01S 5/2036* (2013.01);
(Continued)

(58) Field of Classification Search
CPC .... H01S 5/1014; H01S 5/2018; H01S 5/2036; H01S 2301/18; H01S 5/1203; H01S 5/12; H01S 5/0287; H01S 5/22
See application file for complete search history.

(56) References Cited

U.S. PATENT DOCUMENTS 4,856,017 A    8/1989    Ungar
4,942,585 A    7/1990    Ungar
(Continued)

FOREIGN PATENT DOCUMENTS

CN    1411114    4/2003
CN    1415128    4/2003
(Continued)

OTHER PUBLICATIONS

International Search Report and Written Opinion for International Application No. PCT/US2014/033563, 8 pages, dated Dec. 23, 2014.
(Continued)

*Primary Examiner* — Xinning(Tom) Niu
(74) *Attorney, Agent, or Firm* — Klarquist Sparkman, LLP

(57) ABSTRACT

A broad area semiconductor diode laser device includes a multiple flared oscillator waveguide including a plurality of component flared oscillator waveguides, each component flared oscillator waveguide including a multimode high reflector facet, a partial reflector facet spaced apart from the high reflector facet, and a flared current injection region extending and widening between the multimode high reflector facet and the partial reflector facet, wherein the ratio of a partial reflector facet width to a high reflector facet width is n:1, where n>1, and wherein the component flared oscillator waveguides of the multiple flared oscillator waveguide are arranged in a row such that portions of the flared current injection regions of adjacently situated component flared oscillator waveguides overlap each other or are in proximity to each other on the order of the wavelength of light emitted by the component flared oscillator waveguides.

26 Claims, 13 Drawing Sheets

(51) Int. Cl.
*H01S 5/028* (2006.01)
*H01S 5/22* (2006.01)
*H01S 5/12* (2006.01)

(52) U.S. Cl.
CPC .............. *H01S 5/0287* (2013.01); *H01S 5/12* (2013.01); *H01S 5/1203* (2013.01); *H01S 5/22* (2013.01); *H01S 2301/18* (2013.01)

(56) References Cited

U.S. PATENT DOCUMENTS

| | | |
|---|---|---|
| 4,977,567 A | 12/1990 | Hanke |
| 5,003,550 A | 3/1991 | Welch et al. |
| 5,032,219 A | 7/1991 | Buchmann et al. |
| 5,228,049 A | 7/1993 | Paoli |
| 5,337,328 A | 8/1994 | Lang et al. |
| 5,392,308 A * | 2/1995 | Welch .................... G02B 6/305 372/100 |
| 5,499,261 A | 3/1996 | Welch et al. |
| 5,517,517 A | 5/1996 | Liou |
| 5,539,571 A | 7/1996 | Welch et al. |
| 5,602,864 A | 2/1997 | Welch et al. |
| 5,677,920 A | 10/1997 | Waarts et al. |
| 5,794,839 A | 8/1998 | Kimura et al. |
| 5,914,978 A | 6/1999 | Welch et al. |
| 6,014,396 A | 1/2000 | Osinski et al. |
| 6,124,973 A | 9/2000 | Du et al. |
| 6,130,903 A | 10/2000 | Moloney et al. |
| 6,148,013 A | 11/2000 | Geels et al. |
| 6,174,748 B1 | 1/2001 | Jeon et al. |
| 6,181,721 B1 | 1/2001 | Geels et al. |
| 6,192,062 B1 * | 2/2001 | Sanchez-Rubio ..... H01S 5/4062 372/102 |
| 6,301,037 B1 | 10/2001 | Fischer et al. |
| 6,509,547 B1 | 1/2003 | Bernstein et al. |
| 6,525,872 B1 | 2/2003 | Ziari et al. |
| 6,782,024 B2 | 8/2004 | Schmidt et al. |
| 6,798,815 B2 | 9/2004 | Schmidt et al. |
| 6,810,054 B2 | 10/2004 | Sousa et al. |
| 6,816,531 B1 | 11/2004 | Rossin et al. |
| 6,862,300 B1 | 3/2005 | Traut et al. |
| 6,928,097 B2 | 8/2005 | Chida |
| 7,245,803 B2 | 7/2007 | Gunn, III et al. |
| 7,457,338 B2 | 11/2008 | Mawst et al. |
| 7,602,828 B2 | 9/2009 | Rossin et al. |
| 7,623,555 B2 | 11/2009 | Traut et al. |
| 7,697,589 B2 | 4/2010 | Volodin et al. |
| 7,715,457 B2 | 5/2010 | Schmidt et al. |
| 7,733,932 B2 | 6/2010 | Faybishenko |
| 7,817,693 B2 | 10/2010 | Alahautala et al. |
| 8,111,727 B2 | 2/2012 | Harder et al. |
| 8,437,583 B2 | 5/2013 | Ban |
| 8,442,085 B2 | 5/2013 | Sorimachi et al. |
| 8,615,029 B2 | 12/2013 | Ovtchinnikov et al. |
| 9,166,369 B2 | 10/2015 | Kanskar |
| 9,214,786 B2 | 12/2015 | Hemenway et al. |
| 9,627,852 B2 | 4/2017 | Hemenway et al. |
| 2002/0037021 A1 * | 3/2002 | Ohkubo .................... H01S 5/16 372/46.01 |
| 2002/0105718 A1 | 8/2002 | Bacher et al. |
| 2002/0181525 A1 | 12/2002 | Kasukawa |
| 2003/0057427 A1 | 3/2003 | Chida |
| 2003/0219054 A1 | 11/2003 | Capasso et al. |
| 2005/0013337 A1 | 1/2005 | Jung |
| 2006/0023173 A1 | 2/2006 | Mooradian et al. |
| 2007/0053397 A1 | 3/2007 | Burckel et al. |
| 2008/0112450 A1 | 5/2008 | Krakowski |
| 2008/0212632 A1 | 9/2008 | Eberhard et al. |
| 2009/0201962 A1 | 8/2009 | Satoh et al. |
| 2009/0245315 A1 | 10/2009 | Faybishenko |
| 2010/0097680 A1 | 4/2010 | Naftali et al. |
| 2011/0299172 A1 | 12/2011 | Mikhailov et al. |
| 2012/0069861 A1 | 3/2012 | Neuberger |
| 2012/0177077 A1 | 7/2012 | Erbert et al. |
| 2013/0089115 A1 | 4/2013 | Kanskar |
| 2014/0301421 A1 | 10/2014 | Kanskar |

FOREIGN PATENT DOCUMENTS

| | | |
|---|---|---|
| CN | 1672303 | 9/2005 |
| CN | 101714746 | 5/2010 |
| CN | 101490915 | 9/2010 |
| CN | 101833150 | 9/2010 |
| CN | 102255238 | 11/2011 |
| CN | 102401949 | 4/2012 |
| JP | H0220089 | 1/1990 |
| TW | 2007/29650 | 8/2007 |
| WO | WO 01/48874 | 7/2001 |
| WO | WO 2011/020923 | 2/2011 |
| WO | WO 2011/142849 | 11/2011 |

OTHER PUBLICATIONS

International Search Report and Written Opinion for International Application No. PCT/US2013/059970, 6 pages, dated Feb. 6, 2014.
Kanskar et al., "High Reliability of High Power and High Brightness Diode Lasers," nLight Corporation, 10 pages (Feb. 2014).
Larsson et al., "Grating Coupled Surface Emitters: Integrated Lasers, Amplifiers, and Beam Shaping Outcouplers," SPIE Conference on Testing, Packaging, and Reliability of Semiconductor Lasers IV, 3626:190-201 (Jan. 1999).
Odriozola et al., "Design of 1060 nm Tapered Lasers with Separate Contact," Opt. Quant. Electron, 40(14):1123-1127 (Nov. 2008).
Office Action from the Taiwan Patent Office for related Application No. 102136953, dated Jan. 28, 2016, 16 pages.
Sumpf et al., "High-Brightness Quantum Well Tapered Lasers," IEEE J. of Selected Topics in Quantum Electronics, 15(3):1009-1020 (May/Jun. 2009).
Sumpf et al., "1060 nm DBR Tapered Lasers with 12 W Output Power and a Nearly Diffraction Limited Beam Quality," Proc. of SPIE, 7230:72301E1-72301E8 (Feb. 3, 2009).
Walpole, Semiconductor Amplifiers and Lasers with Tapered Gain Regions, Optical and Quantum Electronics, 28(6):623-645 (Jun. 1996).
Wenzel et al., "High-Brightness Diode Lasers," C.R. Physique, 4(6):649-661 (Jun. 2003).
Office Action from the State Intellectual Property Office of the People's Republic of China for related Application No. 201480032789.7, dated Sep. 29, 2016, 15 pages (w/ English translation).
Office Action from the State Intellectual Property Office of the People's Republic of China for related Application No. 201380077216.1, dated Nov. 1, 2016, 32 pages (w/ English translation).
Agrawal, "Lateral Analysis of Quasi-Index-Guided Injection Lasers: Transition from Gain to Index Guiding," *Journal of Lightwave Technology*, LT-2(4):537-543 (Aug. 1984).
Marciante et al., "Nonlinear Mechanisms of Filamentation in Broad-Area Semiconductor Lasers," *IEEE Journal of Quantum Electronics*, 32(4):590-596 (Apr. 1996).
Mehuys et al., "Self-Stabilized Nonlinear Lateral Modes of Broad Area Lasers," IEEE Journal of Quantum Electronics, QE-23(11):1909-1920 (Nov. 1987).
Third Office Action from the State Intellectual Property Office of the People's Republic of China for related Application No. 201480032789.7, dated Jul. 20, 2017, 13 pages (w/ English translation).
International Search Report and Written Opinion for International Application No. PCT/US2013/033424, 9 pages, dated Jul. 18, 2013.
Bartolo, et al. "Mid-infrared angled-grating distributed feedback laser" Applied Physics Letters, 76(22):3164-3166 (May 29, 2000).
Decision of Rejection for from the State Intellectual Property Office of the People's Republic of China for related Application No. 201380077216.1, dated Sep. 5, 2017, 29 pages (w/ English translation).
Demars, et al., "Angled-grating distributed feedback laser with 1 W cw single-mode diffraction-limited output at 980nm," Lasers and Electro-Optics, pp. 77-78 (Jun. 1996).
Guther, "Beam propagation in an active planar waveguide with an angled bragg grating," Journal of Modern Optics, 45(7):1537-1546 (Jul. 3, 2009).

(56) References Cited

OTHER PUBLICATIONS

International Search Report and Written Opinion for related International Application No. PCT/US2016/036080, dated Sep. 8, 2016, 5 pages.
Lang, et al., Theory of Grating-Confined Broad-Area Lasers, IEEE Journal of Quantum Electronics, 24(11):2196-2210 (Nov. 1998).
Paschke, et al., "High power and high spectral brightness in 1060 nm alpha-dfb lasers with long resonators," Electronics Letters, 39(4):369-370 (Feb. 20, 2003).
Paschke, et al., "Properties of ion-implanted high-power angled-grating distributed-feedback lasers," IEEE Journal of Selected Topics in Quantum Electronics, 9(5):1172-1178 (Sep./Oct. 2003).
Sarangan et al., "Spectral Properties of Angled-Grating High-Power Semiconductor Lasers," IEEE Journal of Quantum Electronics, 35(8):1220-1230 (Aug. 1999).
Venus et al., "Spectral stabilization of laser diodes by external Bragg resonator," Venus-SSDLTR, 5 pages (2004).
Wong et al., "Angled-grating distributed-feedback laser with 1.2 W cw single-mode diffraction-limited output at 1.06 µm," Laser and Electro-Optics, pp. 34-35 (May 1998).
Zhao, et al., "Folded cavity angled-grating broad-area lasers," Optics Express, 21(20):24087-24092 (Oct. 2013).
Zhao et al., "On-chip coherent combining of angled grating diode lasers toward bar-scale single-mode lasers," Optics Express 20(6):6375-6384 (Mar. 12, 2012).
Zhu et al., Modal Gain Analysis of Transverse Bragg Resonance Waveguide Lasers With and Without Transverse Defects, IEEE Journal of Quantum Electronics, 43(10):934-940 (Oct. 2017).
Office Action from the State Intellectual Property Office of the People's Republic of China for related Application No. 201480032789.7, dated Mar. 8, 2017, 16 pages (w/ English translation).
Office Action from the State Intellectual Property Office of the People's Republic China for related Application No. 201380077216.1, dated Nov. 1, 2016, 32 pages (w/ English translation).
Decision of Rejection for from the State Intellectual Property Office of the People's Republic of China for related Application No. 201480032789.7, dated Nov. 30, 2017, 12 pages (w/ English translation).

\* cited by examiner

MULTIPLE FLARED LASER OSCILLATOR WAVEGUIDE

CROSS-REFERENCE TO RELATED APPLICATIONS

This application claims the benefit of U.S. Provisional Application No. 62/062,146, entitled "Multiple Flared Laser Oscillator Waveguide" and filed Oct. 10, 2014, which is incorporated herein by reference.

This application is also related to U.S. Provisional Patent Application No. 61/810,261 entitled "Flared Laser Oscillator Waveguide" and filed Apr. 9, 2013, U.S. patent application Ser. No. 14/011,661 entitled "Flared Laser Oscillator Waveguide" and filed Aug. 27, 2013 (now U.S. Pat. No. 9,166,369), and U.S. patent application Ser. No. 14/249,276 entitled "Diode Laser Packages with Flared Laser Oscillator Waveguides" and filed Apr. 9, 2014, each of which is incorporated herein by reference.

BACKGROUND

1. Field

Generally, this disclosure relates to semiconductor diode lasers. More particularly, the disclosure relates to flared laser oscillator waveguides.

2. Background

Multimode laser diodes, also known as broad area lasers (BALs), have the property that their slow-axis beam-parameter-product (BPP) and their slow-axis brightness (power÷BPP) degrade progressively when they are driven at higher current to generate higher power. Brightness can be improved in BALs by reducing the emitter width; however, the current at which the maximum brightness occurs also happens at progressively lower current values. Hence, the maximum output power at the maximum brightness also drops. For power-scaling applications and reducing the cost-per-watt of producing diode lasers, higher brightness at higher output power per emitter is very desirable.

Semiconductor diode lasers are formed by growing multiple layers of semiconductor materials on a suitable substrate with a lattice constant that allows choice of materials to produce desired emission wavelengths. A typical semiconductor laser comprises n-type layers, p-type layers and an undoped active layer between them such that when the diode is forward-biased, electrons and holes recombine in the active region layer to produce light. The active layer (quantum well(s), quantum wire(s) or quantum dots, type-II quantum well(s)) resides in the waveguide layer which has a higher index of refraction compared to the surrounding p- and n-doped cladding layers. Light generated from the active layer is confined in the plane of the waveguide.

A conventional edge-emitting Fabry Perot broad area laser diode is arranged as a rectangular gain or index-guided semiconductor structure. Opposing end facets of the waveguide define high and partial reflectors to provide feedback for oscillation of light within the resonator. The multi-layered semiconductor laser diode structure extends the length of the laser and has a broad width for electrical injection extending to opposite side surfaces which also extend the length of the laser. The multi-layered semiconductor materials are typically arranged so that the laser operates in a single mode along the growth direction of the laser and this direction is defined as fast-axis direction. Since along the fast-axis direction the semiconductor laser operates in a single mode, the brightness of laser diode in this direction cannot be improved any further—it is so called diffraction-limited. The distance between the top and bottom surfaces of the multi-layered semiconductor laser structure thus provides the smaller dimension of the end facets, i.e., the thickness of the stripe, typically on the order of microns. On the other hand, the width of the multi-layered laser structure provides the larger dimension of the end facets, i.e., the stripe-width is typically on the order of many tens of microns to hundreds of microns. Because the stripe width is much larger than the wavelength of light, the lateral property of an optical field propagating along the optical axis of the waveguide is highly multimode along the longer stripe dimension and the corresponding axis is described as slow-axis.

Diode laser ridge waveguide structures with single-mode structural characteristics across the slow-axis have been described which may be suitable for lower powers where single-mode performance is desirable. For example, in U.S. Pat. No. 6,014,396 to Osinki et al. a flared semiconductor optoelectronic device is disclosed that has a double-flared structured. Other examples of conventional ridge waveguide structures can be found in U.S. Pat. Nos. 7,623,555 and 6,798,815. These devices have single mode beam quality in both directions but such performance comes at the expense of limited output power. However, the problem of scaling to higher powers while maintaining superior brightness continues to pose a challenge in the art of diode lasers, particularly where devices are highly multimode across the slow axis, and so a need remains for improvements associated therewith.

SUMMARY

Embodiments of the disclosed technology satisfy the aforementioned need by providing innovations in broad area semiconductor diode laser technology which include providing a multiple flared oscillator waveguide having a plurality of component flared oscillator waveguides, each component flared oscillator waveguide including a multimode high reflector facet, a partial reflector facet spaced apart from the high reflector facet, and a flared current injection region extending and widening between the multimode high reflector facet and the partial reflector facet, wherein the ratio of a partial reflector facet width to a high reflector facet width is n:1, where n>1, wherein the component flared oscillator waveguides of the multiple flared oscillator waveguide are arranged in a row such that portions of the flared current injection regions of adjacently situated component flared oscillator waveguides overlap each other or are in proximity to each other on the order of the wavelength of light emitted by the component flared oscillator waveguides. Flared oscillator waveguides exhibit improved performance over conventional BALs lasers having a rectangular geometry, and by providing a plurality of flared oscillator waveguides overlapping or in close proximity, additional performance benefits can be obtained. For flared oscillator waveguides, by narrowing the width of the electrically-pumped stripe towards the high reflector facet, the higher order modes with higher divergence angles are prevented from coupling back into the laser. As a result, the slow-axis divergence of the laser is smaller compared to a device with rectangular geometry having the same width for the partial reflector.

Furthermore, light propagating in the flared current injection region can form a thermal waveguide that is closer to the width of the narrower, high reflector side causing a beam output at the partial reflector facet to have a substantially narrower beam width than the partial reflector facet width. As a result, the-beam-parameter-product, BPP (slow-axis near-field width times the slow-axis divergence) is smaller for flared laser oscillator waveguide (FLOW) devices compared to conventional BAL devices. Since the near-field is smaller than the physical width at the partial reflector side, FLOW devices can be designed to have a larger total area compared to conventional BALs without sacrificing BPP. The enlarged total pumped area provided by the flaring of the flared current injection region serves to reduce thermal resistance and electrical series resistance in the device, resulting in higher electrical-to-optical power conversion efficiency. This leads to higher output power at a given operating current compared to conventional BAL devices. Higher power and smaller BPP leads to increased beam brightness in the slow-axis.

In addition to the application to broad area diode lasers, the FLOW concept can also be applied to other types of semiconductor-based Fabry-Perot lasers, such as quantum cascade laser (QCL), interband quantum cascade lasers (IQL), by way of example. Broad area diode lasers with flared laser oscillator waveguides can also find particular use in laser diode modules, which can be configured for various applications such as fiber-coupling or direct pumping.

The foregoing and other objects, features, and advantages will become more apparent from the following detailed description, which proceeds with reference to the accompanying figures, which are not necessarily drawn to scale, and which can include exaggerated features or dimensions for illustrative purposes.

DETAILED DESCRIPTION

Figure 1:
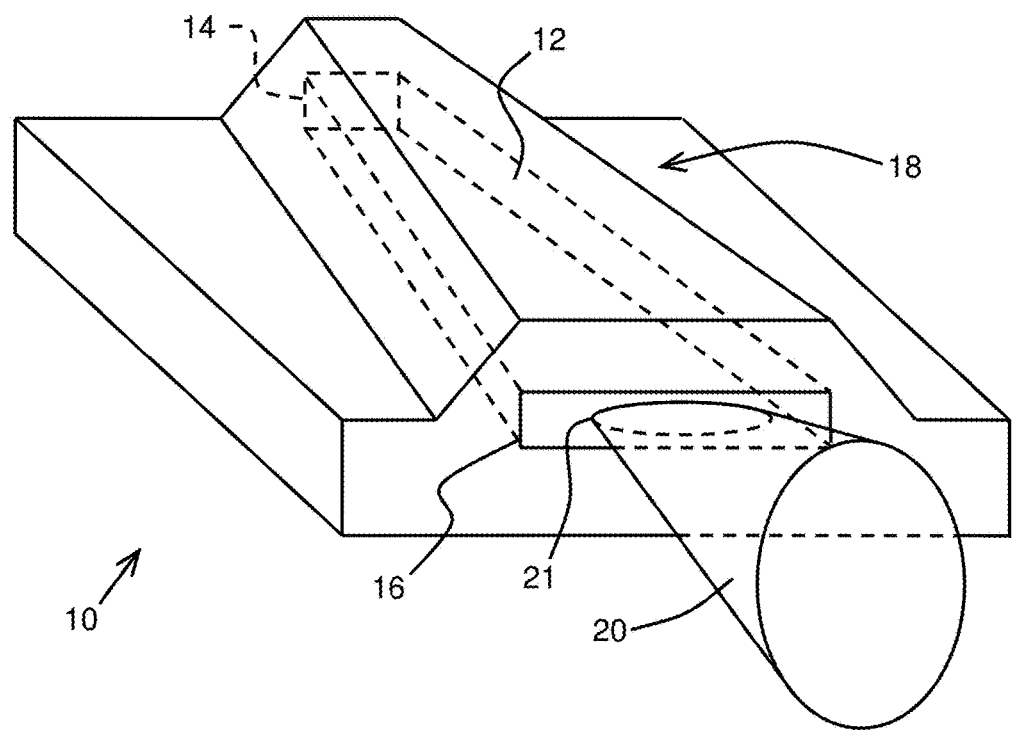
FIG. 1 is a perspective view of flared laser oscillator waveguide device in accordance with an aspect of the disclosed technology.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description some-times uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

As used herein, optical radiation refers to electromagnetic radiation at wavelengths of between about 100 nm and 10 µm, and typically between about 500 nm and 2 µm. Examples based on available laser diode sources and optical fibers generally are associated with wavelengths of between about 800 nm and 1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light in some examples, and need not be at visible wavelengths.

Typical laser diodes have emission regions having noncircular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product ("BPP", corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics.

Referring to FIG. 1, a perspective view is shown of a first embodiment of a broad area flared laser oscillator waveguide (FLOW) device, generally designated 10, in accordance with an aspect of the disclosed technology. The device 10 includes a current injection region 12 for electrical pumping, the region 12 having a trapezoidal shape extending between a high reflecting back facet 14 and a partial reflecting front facet 16. The device 10 can have a ridge, or mesa, shaped structure 18 as depicted in FIG. 1 forming an index-guided region or the shape 18 depicted in FIG. 1 can be gain-guided. The device 10 is configured for emission of a laser beam 20 out of the front facet 16 thereof. A beam spot 21 is formed on the front facet 16 of the device 10 as the beam 20 is emitted therefrom. Ridge structures, particularly active portions thereof, can be made in part from a variety of different conventional semiconductor materials typically grown in layers through conventional semiconductor deposition processes. Exemplary materials include GaAs, AlGaAs, InGaAsP, InGaAs, InP, other elements in the III & V columns, and various combinations thereof. Suitable deposition processes can include CVD, MOCVD, and MBE.

Figure 2:
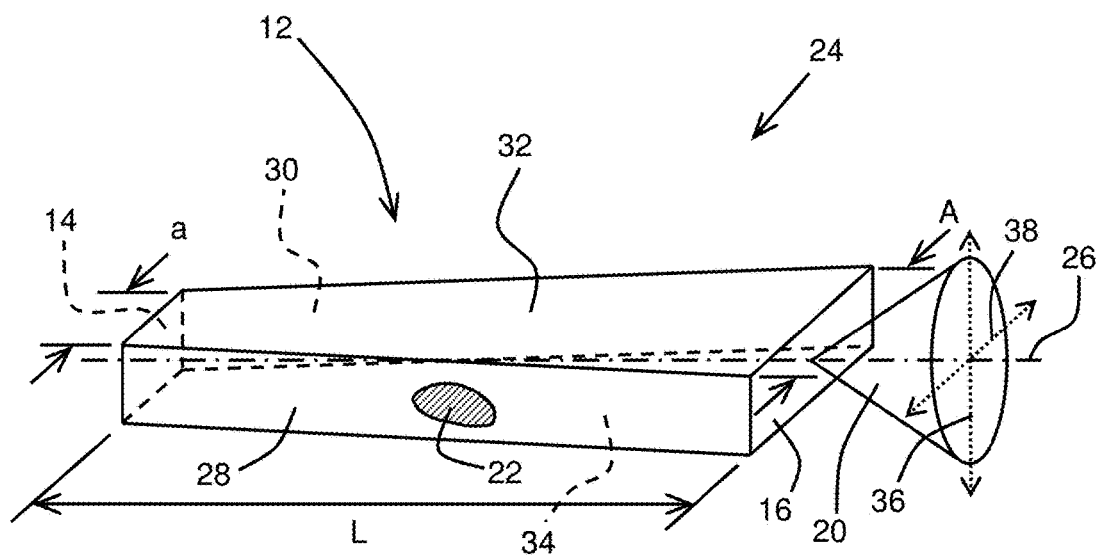
FIG. 2 is a perspective view of an optical resonator of a flared laser oscillator waveguide device in accordance with an aspect of the disclosed technology.

With additional reference to FIG. 2, shown within the ridge structure 18 is an active region 22 formed by the layered semiconductor material. The active region 22 is disposed in, forms a portion of, or defines an optical resonator 24 in which light may oscillate along an optical axis 26 to become amplified. The resonator 24 includes aforementioned back and front facets 14, 16, as well as opposite sides 28, 30. In some examples, the resonator 24 also includes opposite upper and lower surfaces 32, 34 which are coextensive with the current injection region 12 in the device 10. The length of the resonator 24 can be selected for different purposes, such as the end-use application, manufacturing requirements, or optimization requirements. Suitable lengths can include 1 mm or less, 3 mm, 5 mm, 10 mm or more, or other variations thereof. The high reflecting back facet 14 has a narrower width 'a' than a width 'A' of partial reflecting front facet 16. In particular examples herein, both facets 14, 16 have widths that are highly multimode. Thus, for optical wavelengths around 1 µm (e.g., 976 nm), the back facet 14 can have a minimum width 'a' as low as approximately 10 µm, but is preferably around 30 to 75 µm, with other examples also being discussed herein. Other wavelengths are also possible, resulting in different widths, lengths, or other dimensions. Suitable reflectivities for high reflecting back facet 14 includes a reflectivity of 99% or more, but the reflectivity can be selected to be lower as needed. The partial reflecting front facet 16 couples light out of the optical resonator 24 and has a larger width typically associated with conventional broad stripe diode lasers. For example, suitable widths 'A' for the front facet 16 include 25 µm, 50 µm, 75, µm, 150 µm, or larger. The thickness of the facets 14, 16, as well as the thickness of the remainder of the optical resonator 24 is typically uniform, and on the same order as the optical wavelengths. For optical wavelengths of around 1 µm, the thickness of the stripe is typically on the order of a couple of microns. For example, one such device can include a 0.75 µm n-cladding, a 1.5 µm waveguide with quantum well embedded therein, 1 µm p-waveguide, and 0.1 µm highly doped contact layer. Variations in thickness are also possible. Typical reflectivities for the partial reflecting front facet 16 include between 0.05% and 15%, but may be selected or tuned as needed in accordance with the desired output characteristics of the device 10.

Representative beam 20 is also shown being emitted from front facet 16 of optical resonator 24 in FIG. 2. The beam 20 is highly divergent across a fast axis 36 and has a relatively slow divergence across a slow axis 38. The beam 20 is highly divergent across fast axis 36 due to the small thickness of the resonator 24. The beam 20 is slowly divergent across slow axis 38 due to the relatively large minimum width 'a' of the resonator 24. Collimation and redirection optics (not shown) can be positioned in the path of the emitted beam 20 to collimate and direct the beam 20 for subsequent application, such as combining beam 20 with other diode laser beams for coupling into an optical fiber or gain medium.

The beam parameter product (BPP) and beam brightness are characteristics that are typically considered for laser pumping and for other applications of the device 10. The beam parameter product is a measure of beam quality and is given by the product of the divergence angle of a beam with its waist radius. Minimum beam parameter products are desirable for many applications. In typical broad stripe diode structures, slow axis BPP increases as injected current increases due to increase in far-field divergence angle, leading to less desirable beam characteristics as the diodes are driven to higher output powers. Beam brightness is a measure of diode performance and is given by the quotient of beam power and BPP. A higher brightness is desirable for many laser applications, particularly for higher power applications like brightness conversion in fiber lasers. Brightness is also a consideration when optically coupling light into fibers more generally. Brightness is typically approximately flat or increases somewhat as a function of input current for conventional broad area laser diodes.

Figure 3:
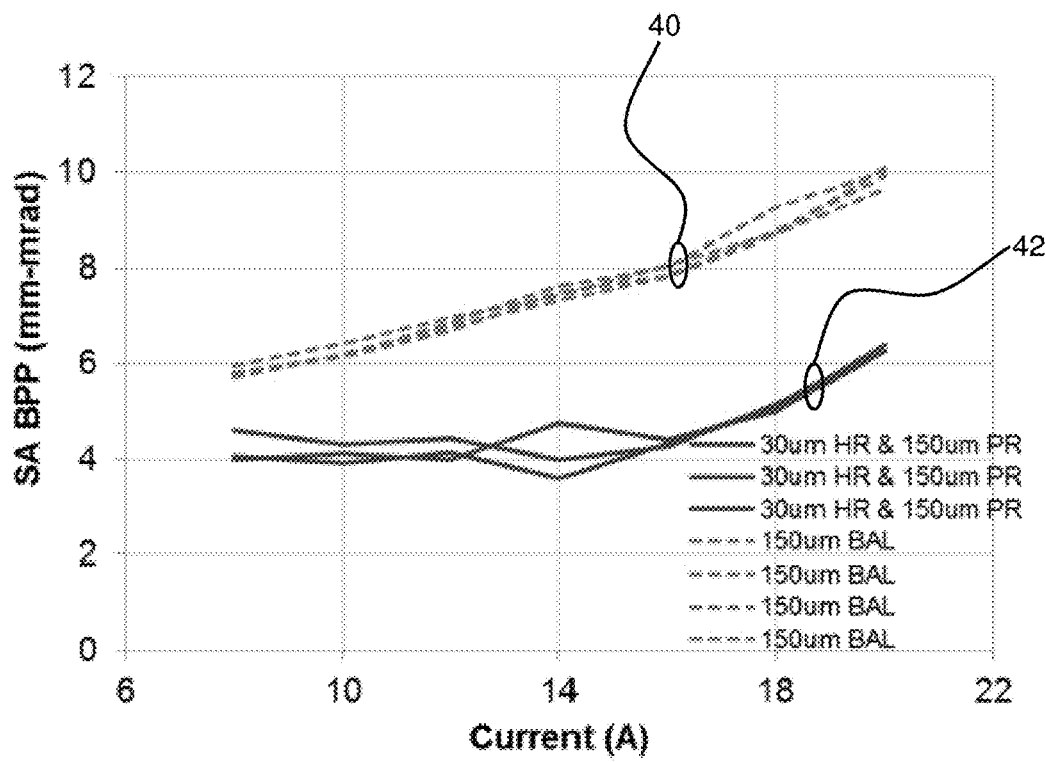
FIG. 3 is a chart of slow-axis (SA) beam parameter product (BPP) for conventional broad area diode laser devices and flared laser oscillator waveguide diode laser devices in accordance with aspects of the disclosed technology.

For example, a BPP-current relation 40 is shown in FIG. 3 for the slow axis of beams emitted from four conventional broad area laser diodes having a constant width (i.e., 'a'='A') of 150 μm along the lengths thereof. The relation 40 shows a BPP of approximately 6 mm-mrad at 8 amps which rises steadily to 10 mm-mrad at 20 amps. In contrast, a BPP-current relation 42 is shown for three example devices 10 having an 'a' dimension of 30 μm for high reflecting back facet 14 and an 'A' dimension of 150 μm for partial reflecting front output facet 16 and a constant linear change in resonator width therebetween. The BPP of beams for the three example flared devices 10 is approximately 4 mm-mrad at 8 amps up to approximately 16 amps where BPP rises steadily to approximately 6 mm-mrad at 20 amps. Thus, devices 10 in accordance with aspects of the disclosed technology are operable to deliver enhanced BPP performance compared with conventional broad area laser diodes over a portion or the entirety of the diode laser device operational range. In some examples, and also in relation to input current, devices 10 can provide 10%, 20%, or even 50% or more of improvement in BPP over conventional broad area laser diodes.

Figure 4:
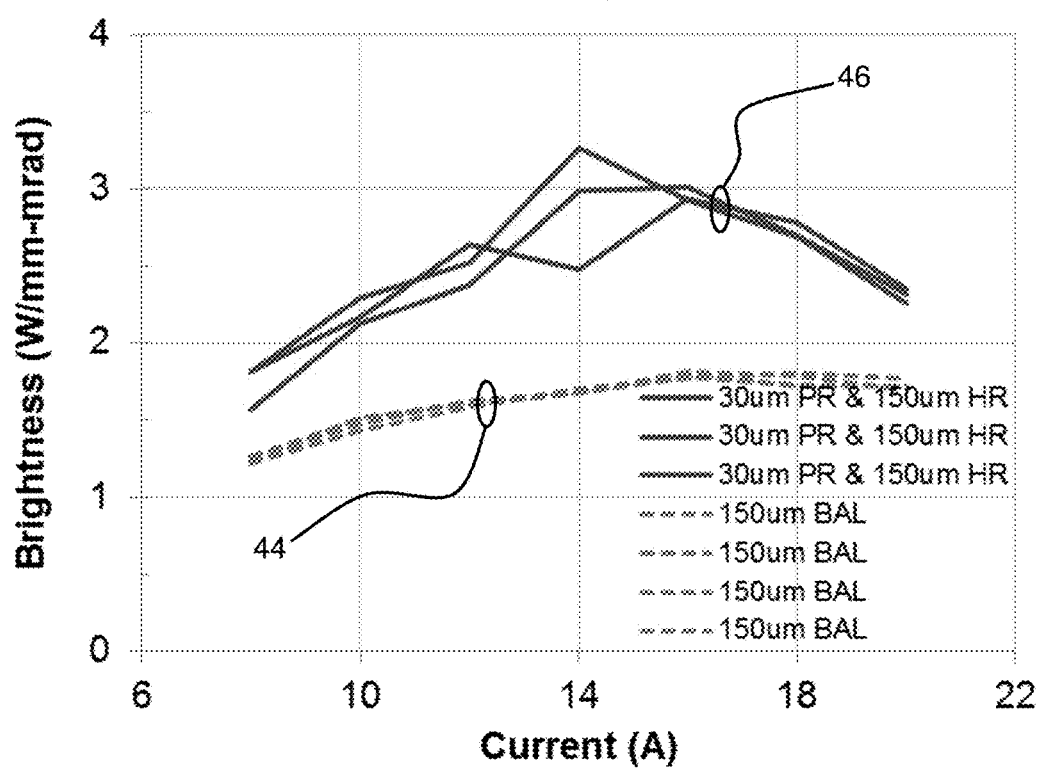
FIG. 4 is a chart of slow-axis (SA) brightness for conventional broad area diode laser devices and flared laser oscillator waveguide diode laser devices in accordance with aspects of the disclosed technology.

In addition to substantial improvement in BPP, brightness of devices 10 in accordance with aspects of the disclosed technology can also experience substantial gains in unexpected fashion. For example, a brightness-current relation 44 is shown in FIG. 4 for the slow axis of beams emitted from the four conventional broad area laser diodes described with reference to FIG. 3 above. The relation 44 shows brightness in the range of approximately 1.2 to 1.8 W/mm-mrad from 8 amps to 20 amps. In contrast, a brightness-current relation 46 is shown for the three example devices 10 described with reference to FIG. 3 above. The brightness of beams for the three example flared devices 10 is approximately 2 W/mm-mrad at 8 amps increasing to over 3 W/mm-mrad at 14 amps and descending to approximately 2.4 W/mm-mrad at 20 amps. Thus, devices 10 in accordance with aspects of the disclosed technology are operable to deliver enhanced brightness performance compared with conventional broad area laser diodes over a portion or the entirety of the diode laser device operational range and for similar aperture sizes. In some examples, and also in relation to input current, devices 10 can provide 10%, 20%, 50%, or even 100% or more of improvement in brightness over conventional broad area laser diodes.

Figure 5:
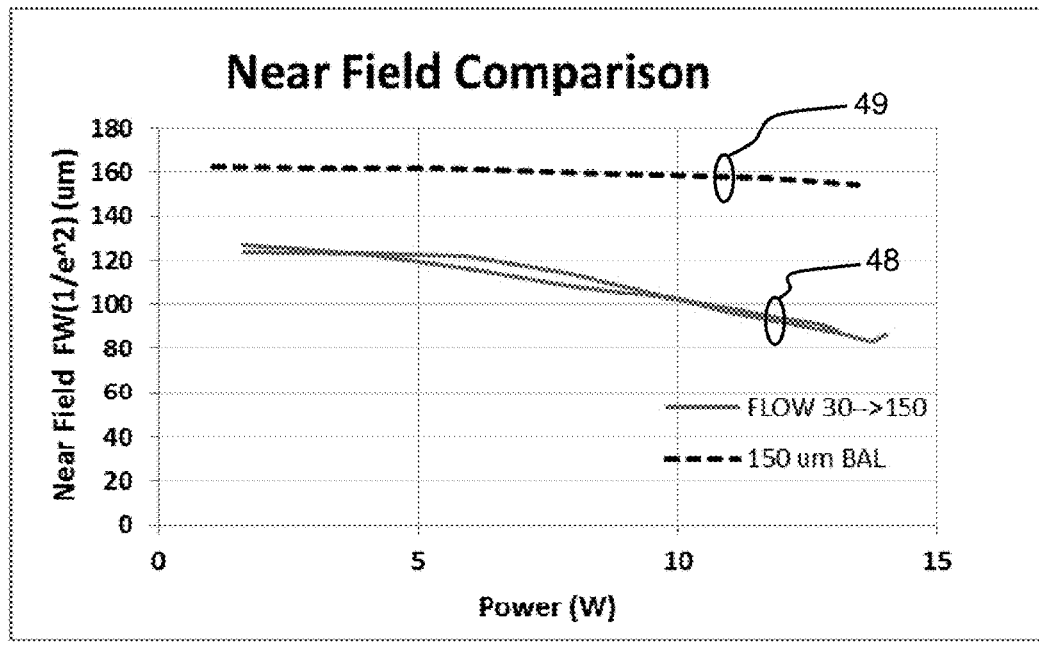
FIG. 5 is a chart showing near field beam width shrinking as a function of operating power for beams emitted from flared laser oscillator waveguide diode laser devices in accordance with aspects of the disclosed technology compared to a broad area laser.
Figure 6:
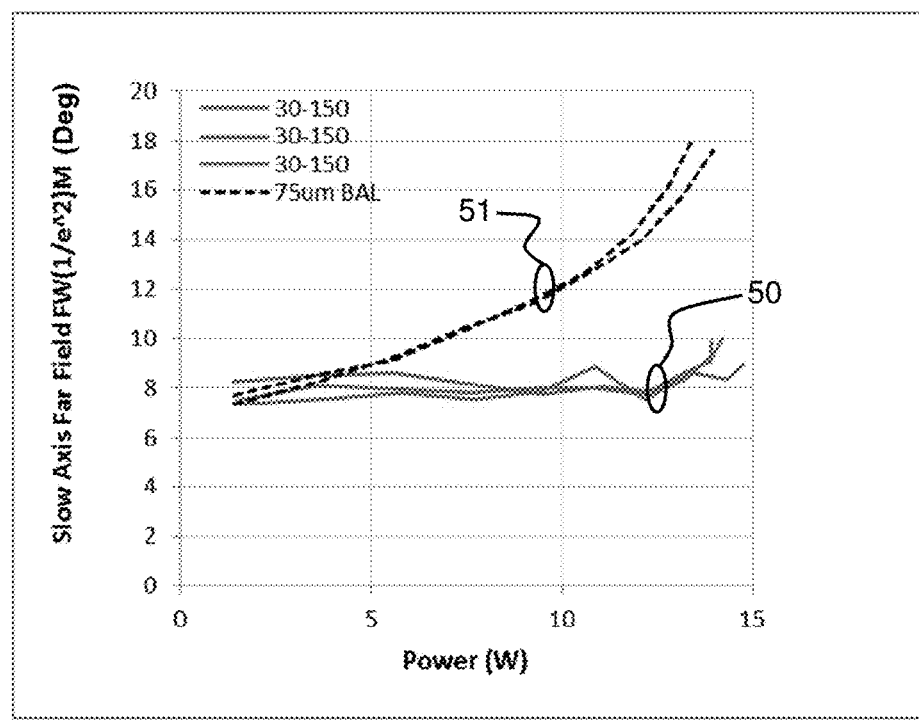
FIG. 6 is a chart showing far field beam divergence as a function of operating power for beams emitted from conventional broad are diode laser devices and flared laser oscillator waveguide diode laser devices in accordance with aspects of the disclosed technology.

The substantial improvements in BPP and brightness can be attributed in part to the near field performance of beams emitted by devices 10. FIG. 5 is a plot of full-width at $1/e^2$ value of the normalized intensity profiles across the slow axis of beams emitted by a device 10 with dimensions described with reference to FIGS. 3 and 4 for different selected power levels ranging from 2 watts to 14 watts. It can be seen that the widths of the beams are consistently smaller by 20% or more and decrease more rapidly for flared laser oscillator waveguide diodes 48 compared to 150 μm broad area lasers 49 as the power increases. Moreover, with additional reference to FIG. 6, the slow-axis far-field divergence 50 of flared laser oscillator waveguide devices start at about 8 degrees at full-width at $1/e^2$ value and remain nearly constant from threshold to 14 watts. For this same operating power range, a 75 μm BAL device slow-axis far-field divergence 51 increases non-linearly from 8 degrees at full-width at $1/e^2$ value at 2 watts to over 18 degrees at full-width at $1/e^2$ value at 14 watts. Improved BPP over conventional devices is attributed to a smaller amount of far field bloom seen in the emitted beam 20 as well as narrower near-field profile compared to BALs. The reduction in near-field bloom can be associated with the increased optical intensity of the beam 20 at the flared front facet 16 and its effective width has narrowed due to guiding and mode stripping caused by the tapered back facet 14. Thus, the output beam 20 typically emits in a spot 21 from the front facet 16 across less than the whole width 'A' thereof.

Figure 7:
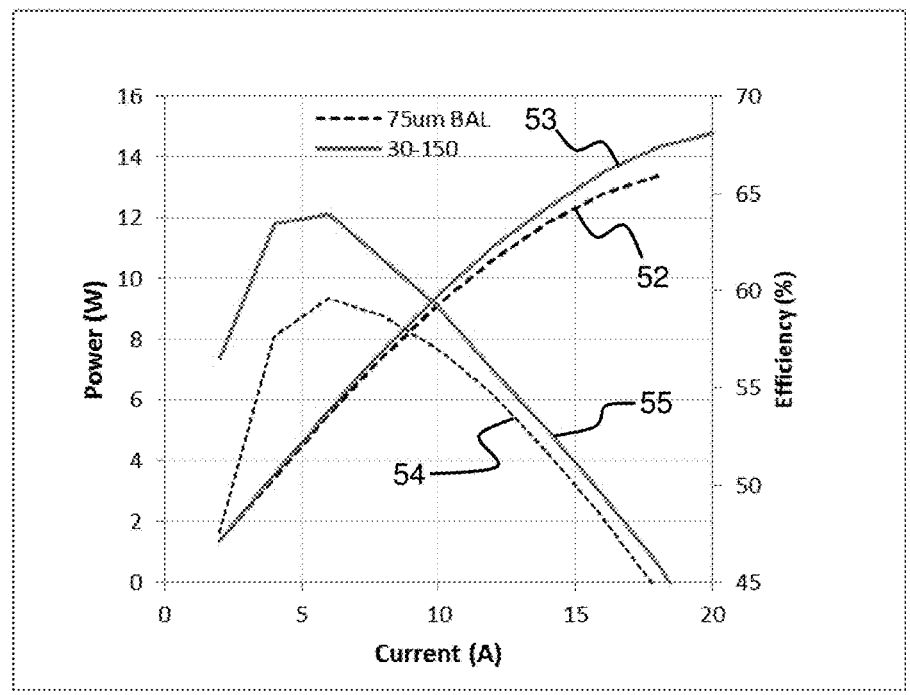
FIG. 7 is a chart showing optical power (Power) as well as electrical-to-optical power conversion efficiency (Efficiency) versus current curves for flared laser oscillator waveguide devices of the disclosed technology and conventional broad area laser diodes.

By selecting the HR back facet 14 to have a narrower width than the PR front facet 16 (i.e., a<A), lateral mode control is introduced into the device 10. Also, the HR back facet 14, as opposed to the PR front facet 16, is selected to have a narrower width since higher order modes reflected at the facet 14 are diffracted at an angle such that the higher order modes do not propagate back into the electrically-pumped region of the device 10. Accordingly, fewer lateral optical modes are propagated in a device 10 across the slow axis compared to a conventional straight broad area laser diode having the same width 'A' for PR output facet 16. Additionally, as the fewer mode light propagates back through the resonator 24, a thermal waveguide is formed therein running the length of the resonator 24 and having a width that is closer to the width 'a' of the narrower high reflecting back facet 14. The corresponding narrower thermal waveguide limits the effective spot size of the beam 20 to a substantially narrower spot 21 as the beam exits the front facet 16. The substantially narrower spot 21 can be narrower by 5%, 20%, 50% or more, for example, and is typically dependent on the input current to the device 10, as illustrated in FIG. 5. The fewer mode thermally guided light emits as a beam 20 that has higher slow axis brightness than conventional broad area laser diodes having the similar exit aperture width. As will be seen hereinafter, due to the lateral mode control introduced by the back facet 14 aperture, the total current-injected area of the device 10 can be optimized to lower both the thermal and electrical resistance thereof for improved performance. Moreover, by flaring the shape of the optical resonator 24 and current injection region 12, the total electrically-pumped area is an enlarged area that does not compromise slow-axis BPP thereby improving the overall thermal resistance and electrical series resistance of the device 10. Consequently, devices 10 achieve higher peak efficiency compared to conventional broad area diode lasers with equal output aperture size yet produce higher output power at the same brightness as illustrated in FIG. 7. Since the size of the output beam 20 is not determined by the pumped output aperture width, the effective area of devices 10 can be larger and therefore the series resistance of the devices 10 can be commensurately lower.

Referring to FIG. 7 a chart is shown of output optical power and electrical-to-optical power conversion efficiency (PCE) as a function of input current for a device 10 having a 30 μm to 150 μm flared current injection configuration and a conventional BAL with a constant width of 75 μm, both devices having a 5 mm cavity length. The output optical power 52 for the 75 μm BAL performs similar to or slightly worse than the output optical power 53 for a flared device 10. The PCE, designated 54, for the 75 μm BAL depicts a similar to or slightly worse result than the PCE, designated 55, for the flared device 10.

Figure 8A:
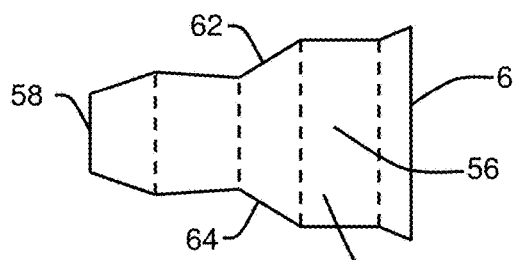
FIGS. 8A-C show top cross-sectional views for three alternative current injection regions in accordance with aspects of the disclosed technology.
Figure 8B:
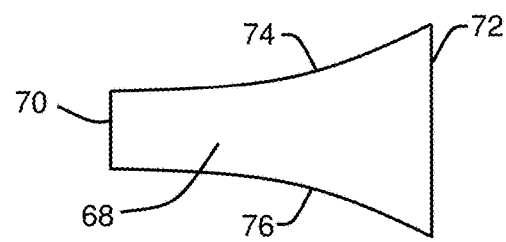
Figure 8C:
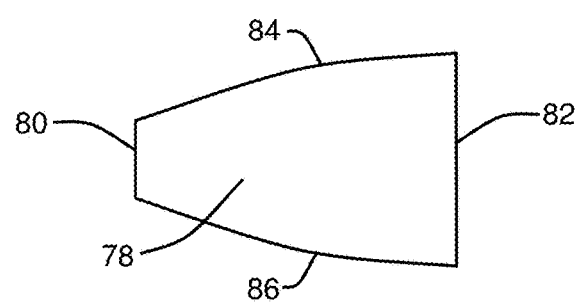

Referring now to FIGS. 8A-8C, there are shown several examples of current injection regions of alternative embodiments of FLOW devices in accordance with the disclosed technology. With particular reference to FIG. 8A, a top view is shown of a trapezoidal perimeter of a current injection region 56 of an alternative embodiment of a flared laser oscillator waveguide device in accordance with an aspect of the disclosed technology. The current injection region 56 has a narrower width for a high reflecting back facet 58, a larger width for a partially reflecting front facet 60, and segmented flat opposing side surfaces 62, 64 extending between the facets 58, 60. The current injection region 56 includes a plurality of flared regions 66 of different widths, though each flared region 66 is wider than the high reflecting back facet 58. In FIG. 8B, a top view is shown of a perimeter of an inward curved current injection region 68 of another alternative embodiment of a flared laser oscillator waveguide device in accordance with an aspect of the disclosed technology. The current injection region 68 has a narrower width for a high reflecting back facet 70, a larger width for a partially reflecting front facet 72, and a pair of smooth flared side surfaces 74, 76 extending between the facets 70, 72. In FIG. 8C, a top view is shown of a perimeter of an outward curved current injection region 78 of another alternative embodiment of a flared laser oscillator waveguide device in accordance with an aspect of the disclosed technology. The current injection region 78 has a narrower width for a high reflecting back facet 80, a larger width for a partially reflecting front facet 82, and a pair of smooth flared side surfaces 84, 86 extending between the facets 80, 82. Various combinations of shapes described for regions 56, 68, 78 are also possible.

Figure 9A:
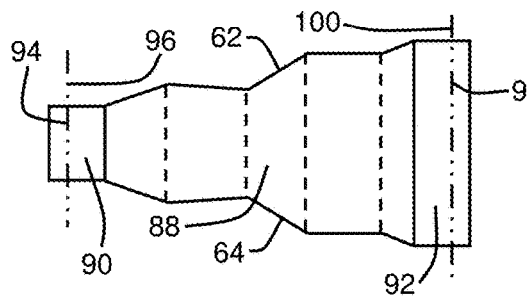
FIGS. 9A-C show top cross-sectional views for three alternative current injection regions in accordance with aspects of the disclosed technology.
Figure 9B:
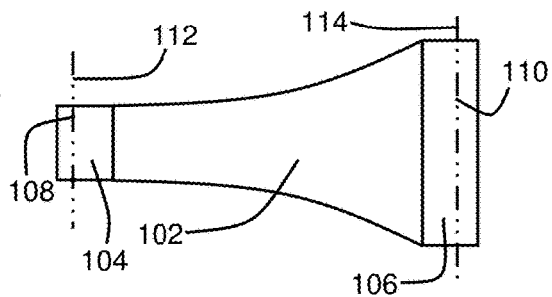
Figure 9C:
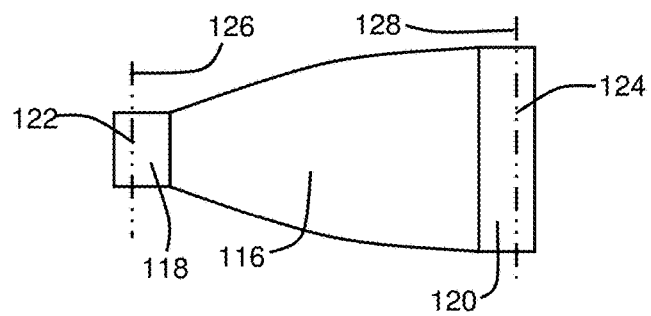

Referring now to FIGS. 9A-9C, additional examples are shown of current injection regions which are similar to the regions shown in FIGS. 8A-8C and to which reference shall be made with respect to like numerals. Thus, in FIG. 9A, a top view of a current injection region 88 is shown for an alternative embodiment of a flared laser oscillator waveguide device, the region 88 being similar to current injection region 56 having a plurality of flared regions 66 to the extent that region 88 also includes a plurality of flared regions 66. Region 88 also includes narrower and wider end rectangular portions 90, 92 extending from the respective opposite narrower and wider end regions 66 of region 56. The narrower end rectangular portion 90 extends a predetermined distance allowing a high reflecting back facet 94 to be formed, e.g., through cleaving along a cleave plane 96, that has a well-defined aperture. Because the rectangular portion 90 has a constant width parallel to the cleaving plane 94, variation in the location of the cleaving plane 94 does not affect the selected width of the back facet 94. The wider end rectangular portion 92 extends a predetermined distance allowing a partially reflecting front facet 98 to be formed, e.g., through cleaving along a cleave plane 100, that also has a well-defined aperture. In FIG. 9B, a current injection region 102 has a inwardly curved middle portion extending between a narrower end rectangular extension 104 and a wider end rectangular extension 106. The rectangular extensions 104, 106 extend predetermined distances allowing respective high reflecting back and front facets 108, 110 to be formed at respective cleaving planes 112, 114, so as to provide the formed facets 108, 110 with well-defined apertures. In FIG. 9C, a current injection region 116 has a outwardly curved middle portion extending between a narrower end rectangular extension 118 and a wider end rectangular extension 120. The rectangular extensions 118, 120 extend predetermined distances allowing respective high reflecting back and front facets 122, 124 to be formed at respective cleaving planes 126, 128, so as to provide the cleaved facets 122, 124 with well-defined apertures.

With respect to embodiments described in FIGS. 9A-9C, the various segmented and curved shapes can be combined in various ways, and rectangular extensions can be added or defined for one or both ends of a current injection region of a device. The rectangular extending portions can be advantageous in manufacturing by providing predictability with respect to the apertures of the back and front facets. A cleaving plane can be coplanar or approximately coplanar with the defined exposed end of the corresponding rectangular extending portion, or alternatively the cleaving plane can be as depicted in FIGS. 9A-9C at a distance from the defined exposed end along the predetermined length of the rectangular extending portion. Thus, while error may be allowed in the precise location of a cleave plane, the well-defined width of the facet is maintained. Moreover, the cleave planes and corresponding facets formed thereby need not be perpendicular to the current injection region or optical axis thereof allowing for angular cleaves, etc.

Figure 10:
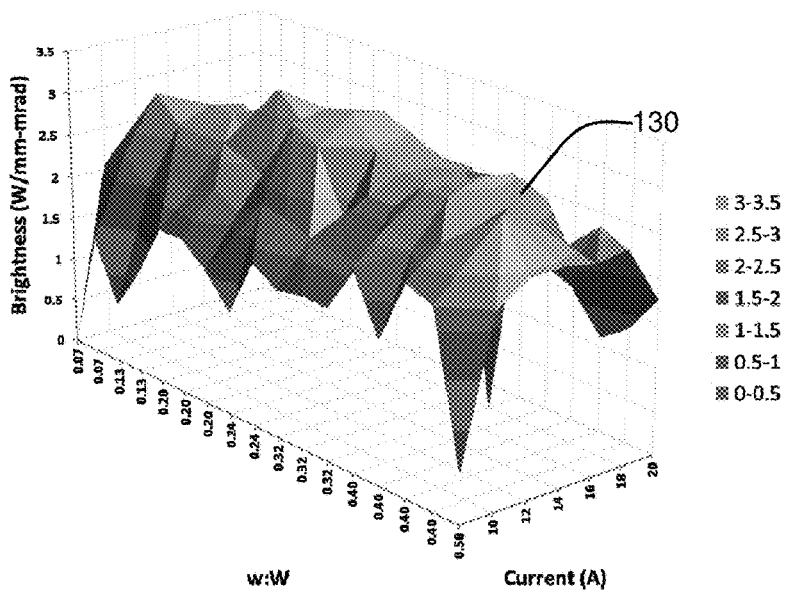
FIG. 10 is a three dimensional chart showing current and brightness for different facet width ratios in accordance with an aspect of the disclosed technology.

Various examples of the flared laser oscillator waveguide devices in accordance with the disclosed technology can be gain-guided or index-guided which can be implemented in different ways, though the methods described herein are not intended as exhaustive. For example, in a gain-guided design, a p-contact can be delineated in accordance with the top view current injection region perimeters described in FIGS. 8A-9C. The pattern of the p-contact is formed by making an opening in one or more layers of dielectric of the flared laser oscillator waveguide device 10. A p-contact is then deposited to form the pattern as described hereinabove. Alternatively, a deposited p++ doped contact layer can be etched away where the contact is not desired, i.e., outside of a current injection region perimeter, so as to define a current-blocking Schottky barrier. One suitable way to fabricate an index-guided design includes etching away deposited semiconductor material down a predetermined distance, such as 0.5 µm, 1 µm, 2 µm, or another selected thickness dependent on the structure of the device 10. By etching away the semiconductor material outside the current-injected area, an index contrast is introduced at the etched step in the lateral (slow-axis) direction In FIG. 10 is shown a three dimensional optimization curve 130 depicting multiple flared laser oscillator waveguide devices 10 having a constant changing current injection region width, such as depicted in FIGS. 1-2, but for different ratios of back facet width to front facet width. Current and slow-axis brightness are also axes for the curve 130 so that corresponding optimized designs can be understood for specified ranges of brightness or injection current. Accordingly, in some examples, the widths of the back and front facets are selected in accordance with an optimized facet width ratio.

Figure 11A:
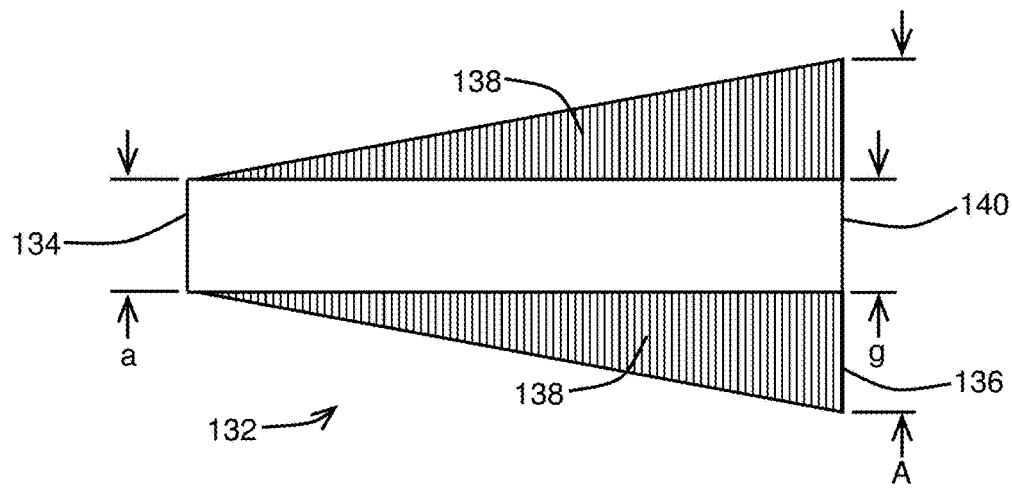
FIGS. 11A-C show top cross-sectional views for three alternative current injection regions and additional higher order mode discriminating features in accordance with aspects of the disclosed technology.
Figure 11B:
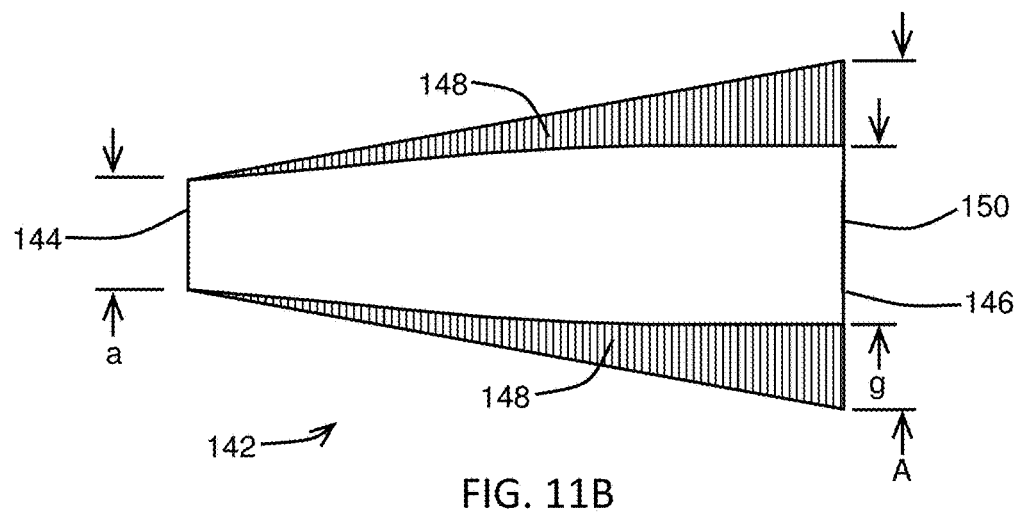
Figure 11C:
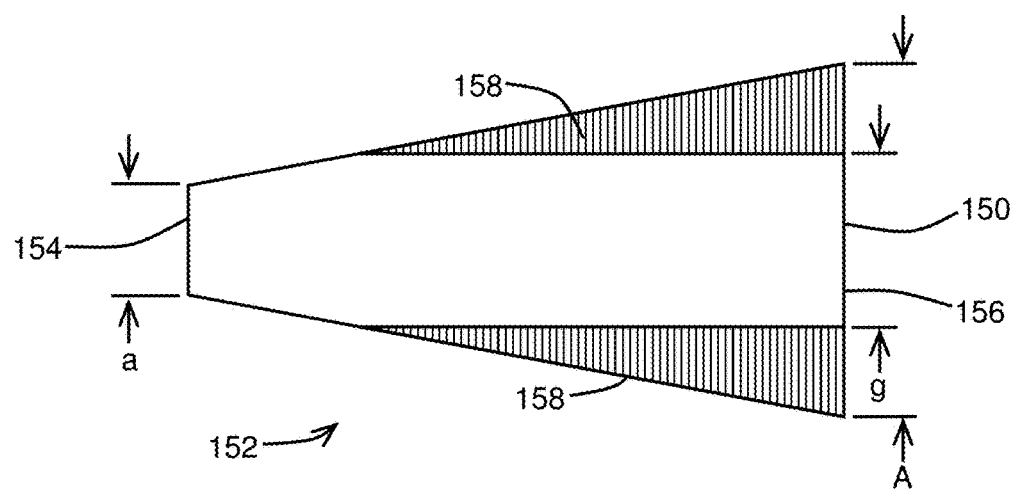

FIGS. 11A-11C illustrate top cross-sectional views of additional embodiments of flared laser oscillator waveguide devices in accordance with aspects of the disclosed technology. In FIG. 11A a flared current injection region 132 is shown extending between a high reflecting back facet 134 with a width 'a' and partial reflecting front facet 136 with a width 'A'. A pair of scattering elements 138 is oppositely positioned in the current injection region 132 and extends between the back facet 134 and the front facet 136. The scattering elements 138 each have a selected width with respect to the width 'A' of the front facet 136 such that a portion 140 of the front facet 136 which does not have scattering elements 138 associated therewith has a smaller width 'g'.

Difference between back facet width 'a' and portion width 'g' is also possible, as illustrated in the alternative embodiments shown in FIGS. 11B and 11C. In FIG. 11B, a flared current injection region 142 also has a back facet 144 with corresponding width 'a' and front facet 146 with a corresponding width 'A'. Current injection region 142 includes lateral scattering elements 148 extending between the back facet 144 and front facet and defining a portion 150 of the front facet 146 with a width 'g' where scattering elements 148 are not present at the interface thereof. Also, scattering elements 148 include a non-linear variation in width, here an interior curved contour, extending between the back and front facets 144, 146.

In FIG. 11C, a flared current injection region 152 also has a back facet 154 with corresponding width 'a' and front facet 156 with a corresponding width 'A'. A pair of scattering elements 158 is oppositely positioned in the current injection region 152 and extends from the front facet 146 to a predetermined distance along the length of the current injection region 152. Also, the scattering elements 158 each have a selected width with respect to the width 'A' of the front facet 156 such that a portion 160 of the front facet 156 which does not have scattering elements 158 associated therewith has a smaller width 'g'. As it will be appreciated by those with skill in the art in view of this disclosure, different variations and combinations of the scattering elements described in FIGS. 11A-11C are possible, including incorporation of other aspects of the disclosed technology herein described.

Various scattering patterns, such as scattering elements 138, 148, 158, are defined in flared laser oscillator waveguide devices of the disclosed technology in order to introduce loss of higher order modes of laser light propagating therein for improved beam output. While different geometric examples are described, the scattering patterns can generally be configured to overlap the modal content of the laser light to achieve higher order mode suppression. Scattering patterns can be formed in a variety of ways to realize mode-stripping effects, including the non-resonant grating, formation of micro-structures that include features with index contrast, or formation of a second-order grating, in the selected patterned area.

Figure 12A:
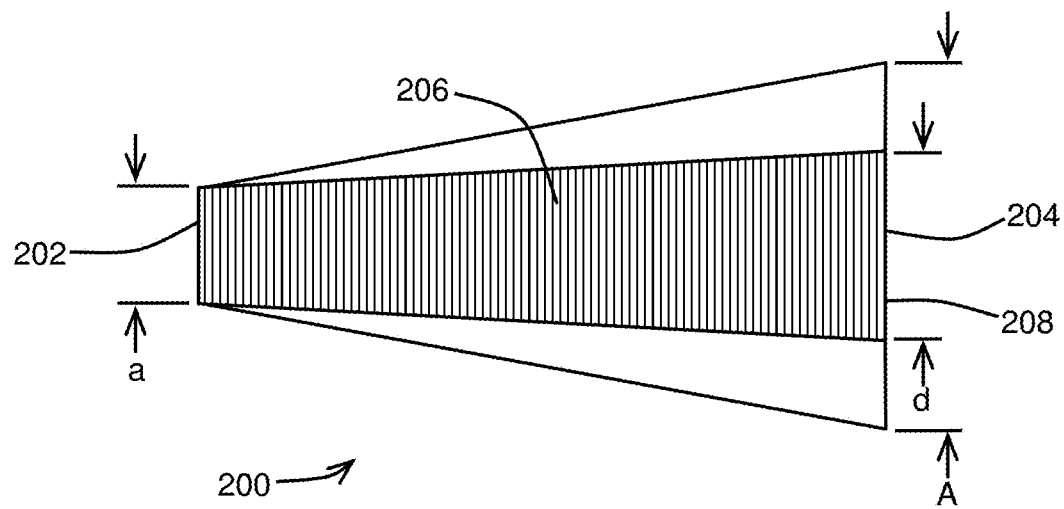
FIGS. 12A-B show top cross-sectional views for two alternative current injection regions and wavelength-stabilizing grating in accordance with aspects of the disclosed technology. 12A shows distributed feedback (DFB) configuration and 12B shows distributed Bragg reflection (DBR) configuration.
Figure 12B:
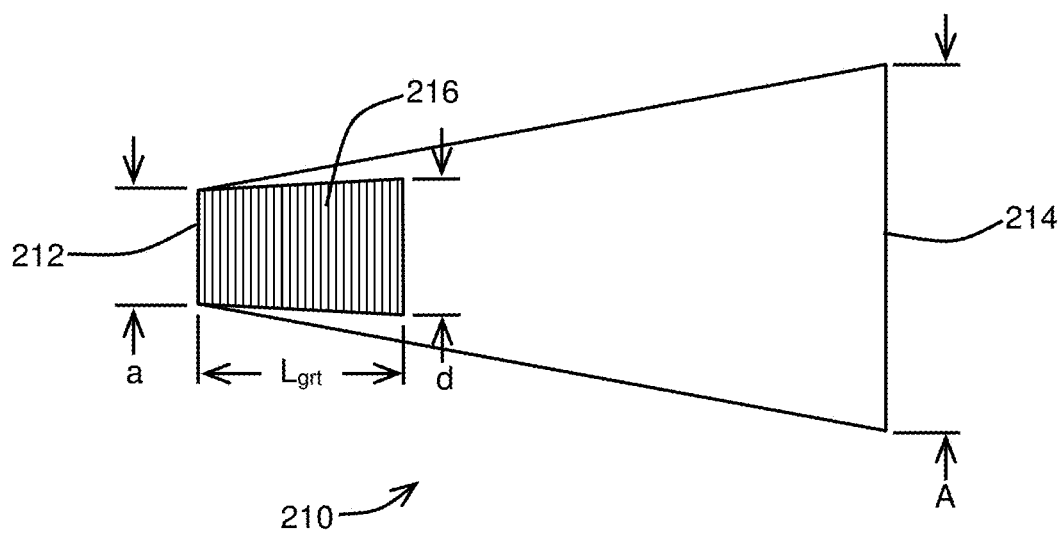

Referring now to FIGS. 12A-12B there are shown additional embodiments of flared laser oscillator waveguide devices in accordance with aspects of the disclosed technology. In FIG. 12A a top cross-sectional view of a current injection region 200 of a flared laser oscillator waveguide device is shown which is configured to be wavelength stabilized. Current injection region 200 includes narrower high reflecting back facet 202 having a width 'a' and a partial reflecting front facet 204 having a width 'A'. A distributed feedback grating 206 is disposed in the flared current injection region 200 so as to extend between the back and front facets 202, 204. Distributed feedback grating 206 can have a variable width as it extends between the facets 202, 204. Moreover, the grating 206 can have a width 'd,' at the partial reflecting front facet 204 to define a grating end portion 208 which need not have the same width 'a' as the high reflecting back facet 202.

While in conventional distributed feedback semiconductor laser diode devices the width of the grating at the front facet is typically coextensive with the width of the front facet and the area of the grating is coextensive with the pumped area of the diode, in devices in accordance with the disclosed technology the width 'd,' of the grating 206 can be selected to be the same or preferably narrower than the width 'A' of the front facet 204. In some examples the width of the grating 206 varies along the length of the region 200. Since the grating 206 has a smaller area than the entirety of region 200, the total scattering loss introduced by imperfections in the grating is reduced, leading to improved operating efficiency.

In FIG. 12B a top cross-sectional view of a current injection region 210 of a flared laser oscillator waveguide device is shown which is also configured to be wavelength stabilized. The region 210 includes a narrower high reflecting back facet 212 having a width 'a' and a partial reflecting front facet 214 having a width 'A'. A distributed Bragg reflector grating 216 is disposed in the region 210 at the high reflecting back facet 212. The grating 216 extends the width 'a' of the back facet 212 at the back facet 212, extends a length '$L_{grt}$' along the longitudinal axis of the device, and extends to a width 'd' inside the region 210. As can be seen from FIG. 12B, the width of 'd' need not be equal to 'a'. In most cases d>a and the width of 'd,' can stretch all the way to the lateral dimension of the pumped region at the location where $L_{grt}$ ends. In some examples, the area of the grating 216 is electrically-pumped with current during operation. The length of the distributed Bragg reflector grating 216 is selected to provide high reflectivity (>90%).

Multiple Flared Laser Oscillator Waveguides

With flared laser oscillator waveguides described hereinabove, considerable improvements have been obtained in diode laser performance over conventional BALs. In particular, improvements to slow-axis brightness at various BPPs have allowed for the possibility of wholesale replacement of high brightness diode lasers with suitable flared laser oscillator waveguides. For example, in conventional BALs, it is generally understood that brightness can be improved by reducing the emitter width. However, the diode current at which the maximum brightness occurs becomes lower, resulting in a lower maximum output power at maximum brightness. Aforementioned embodiments of flared laser oscillator waveguides deliver improved slow axis brightness and BPP. Since various applications for diode lasers require power-scaling at reduced cost/Watt, the present performance improvements and features provided by flared laser oscillator waveguides are very advantageous.

Figure 13:
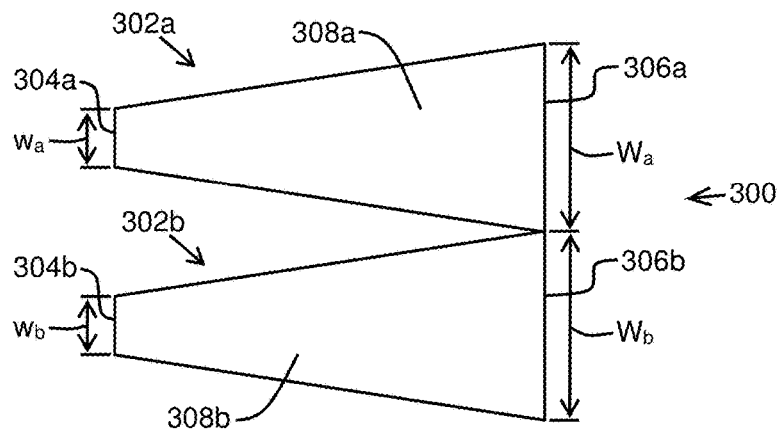
FIGS. 13-17 show multiple flared laser oscillator waveguide embodiments in accordance with aspects of the disclosed technology.

Further enhancements to the flared laser oscillator waveguide architecture have been fortuitously found which deliver further improvements over conventional BALs. In accordance with one aspect of such enhancements, reference is now made to FIG. 13, which discloses an embodiment of a multiple flared laser oscillator waveguide device 300. The device 300 includes a pair of component flared laser oscillator waveguides 302a, 302b each having a high reflectors 304a, 304b with widths $w_a$, $w_b$, partial reflectors 306a, 306b with widths $W_a$, $W_b$ and flared current injection regions 308a, 308b extending between each opposite partial-high reflector pair. As with other flared laser oscillator waveguide embodiments described herein, for each component flared laser oscillator waveguide the partial reflector width W is larger than the high reflector width w such that the ratio of W/w is greater than 1. The constituent waveguides 302a, 302b are situated adjacent to each other to form a double-flared shape where an end of one partial reflector 306a adjoins an opposite end of the adjacent partial reflector 306b.

In one example of a multiple flared oscillator waveguide 300 the high reflector widths $w_a$, $w_b$ are each 35 μm and the partial reflector widths $W_a$, $W_b$ are each 75 μm. When the modeled performance is compared to a single flared oscillator waveguide having a high reflector width of 70 μm and a partial reflector width of 150 μm, it is found that the multiple flared oscillator waveguide 300 provides superior brightness for the same BPP. For fiber-coupling diode laser beams into a conventional 105 μm 0.15 NA optical fiber, a maximum BPP of about 5 mm-mrad may be required. With cavity lengths of 5 mm, a brightness of about 2.9 W/mm-mrad and output power of 14.7 W can be achieved with a single flared laser oscillator waveguide, while a brightness of about 4.0 W/mm-mrad and output power of 20.2 can be achieved with a multiple flared laser oscillator waveguide having two component flared laser oscillator waveguides. Thus, a multiple flared oscillator waveguide 300 can deliver a better than 30% increase in brightness at a BPP of 5 mm-mrad over a single flared oscillator waveguide, with the single flared oscillator waveguide itself delivering performance improvement over conventional BALs. Accordingly, embodiments of multiple flared oscillator waveguides, including waveguide 300, can be configured to provide increased maximum brightness and maximum power for a given BPP.

Figure 18:
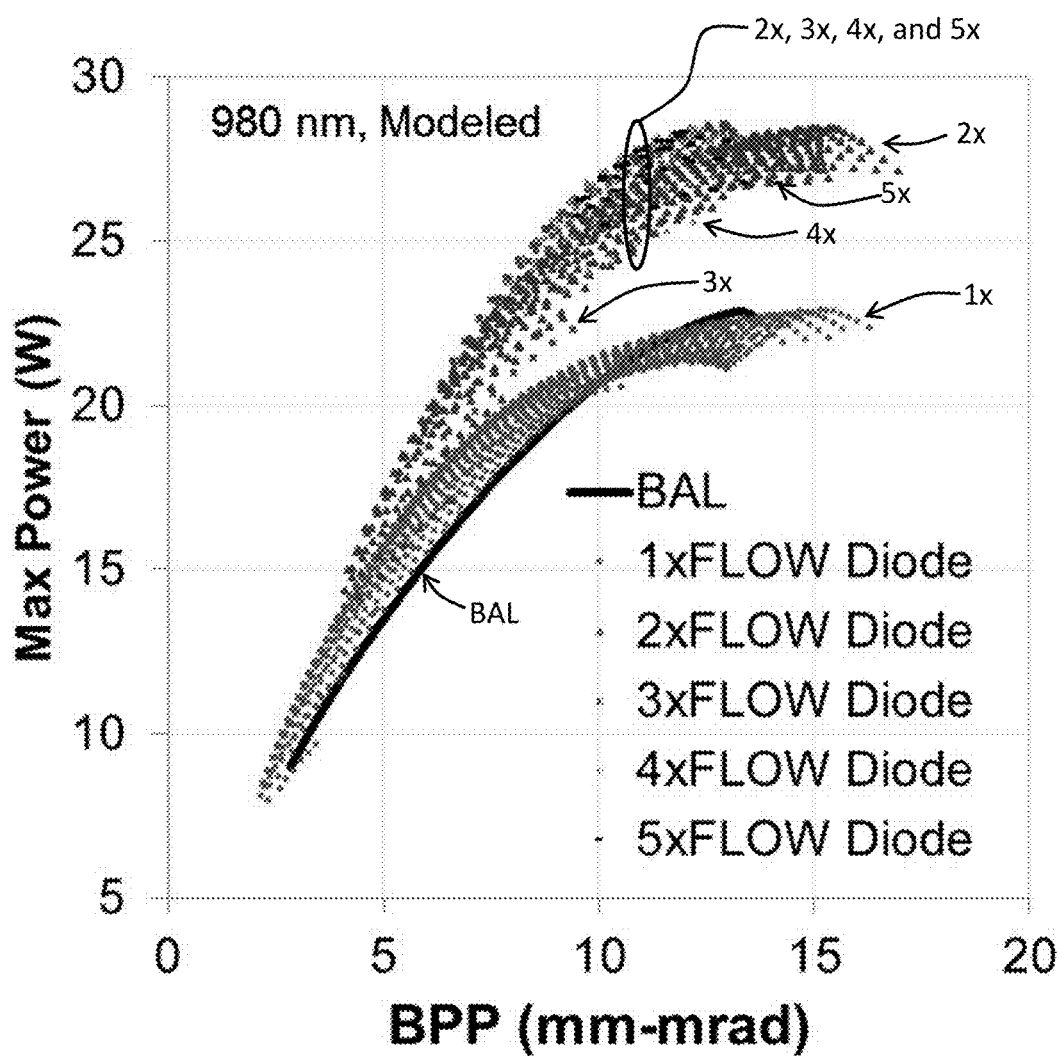
FIG. 18 is a plot of maximum power against BPP for 980 nm conventional BALs, single flared laser oscillator waveguides, and multiple flared laser oscillator waveguides.
Figure 19:
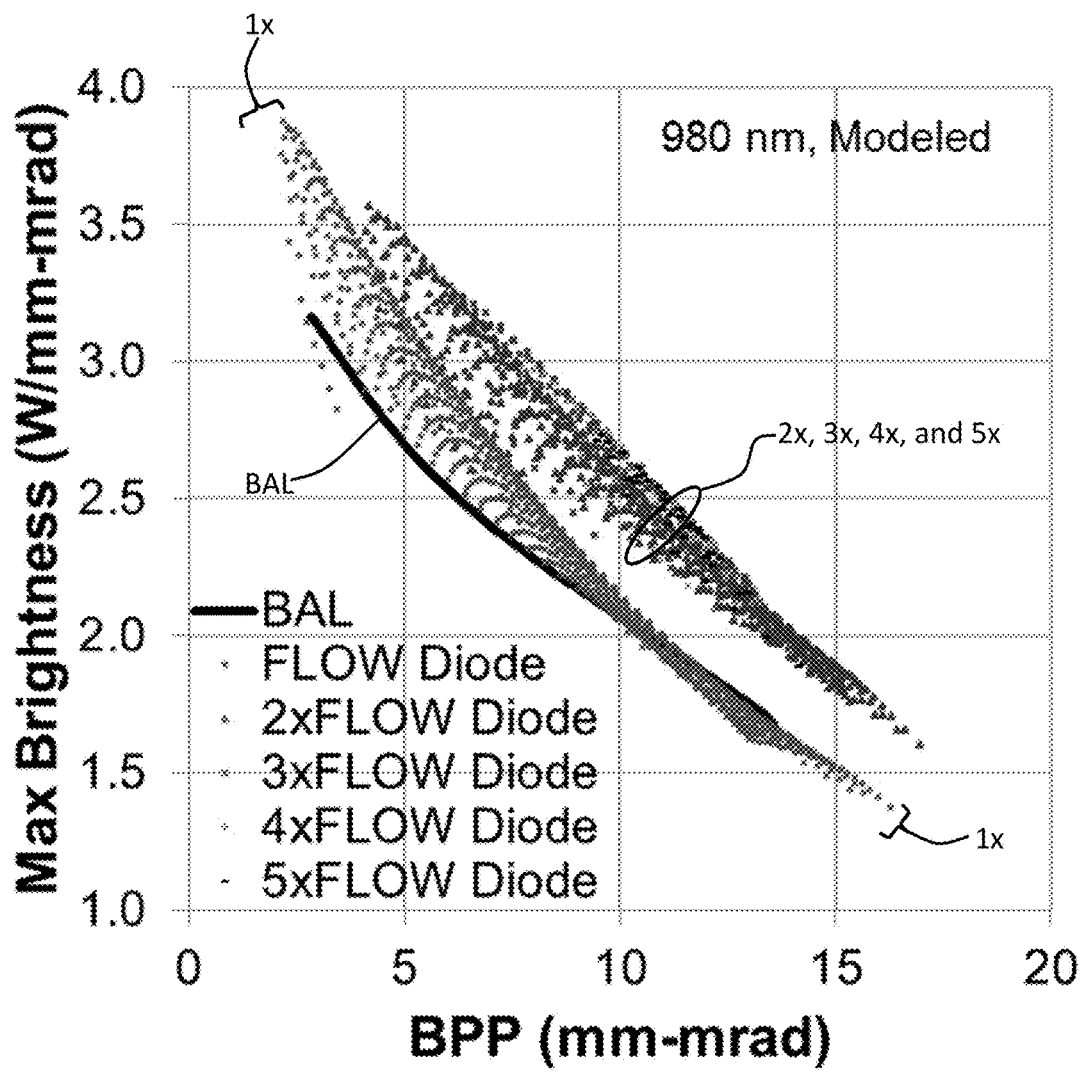
FIG. 19 is a plot of maximum brightness against BPP for 980 nm conventional BALs, single flared laser oscillator waveguides, and multiple flared laser oscillator waveguides.
Figure 20:
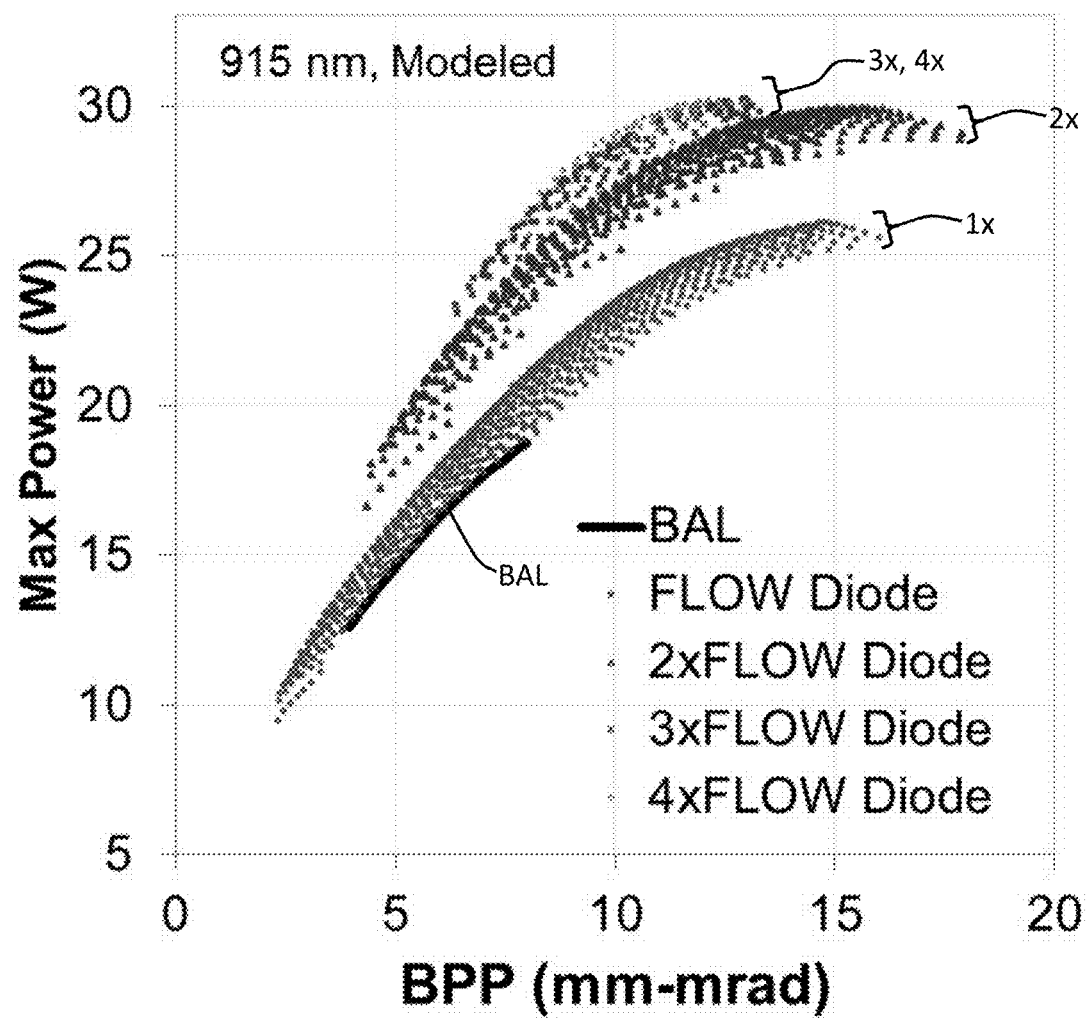
FIG. 20 is a plot of maximum power against BPP for 915 nm conventional BALs, single flared laser oscillator waveguides, and multiple flared laser oscillator waveguides.
Figure 21:
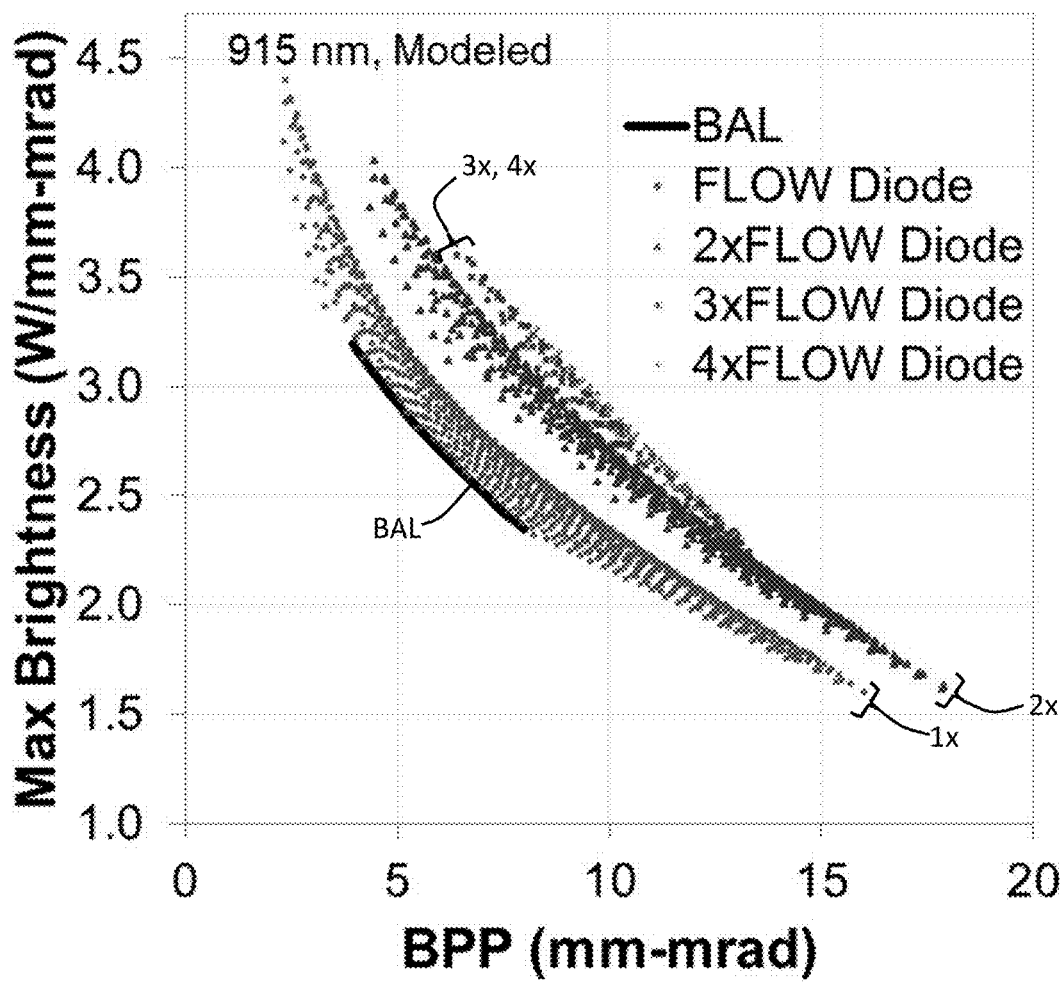
FIG. 21 is a plot of maximum brightness against BPP for 915 nm conventional BALs, single flared laser oscillator waveguides, and multiple flared laser oscillator waveguides.

In addition to providing the aforementioned advantages, multiple flared laser oscillator waveguide architecture allows the possibility to maintain maximum brightness at any BPP. That is, with conventional BALs having equal high reflector and partial reflector widths, as BPP increases for larger emitter widths, achievable brightness at the increased BPP decreases. FIGS. 18-21 depict some performance improvements of multiple flared oscillator waveguides over conventional non-flared BALs. In FIGS. 18-21, single flared laser oscillator waveguides are indicated as 1×, multiple flared laser oscillator waveguides having two component flared laser oscillator waveguides are indicated as 2×, three component flared laser oscillator waveguides as 3×, four component flared laser oscillator waveguides as 4×, five component flared laser oscillator waveguides as 5×, and conventional broad area lasers as BAL. FIGS. 18 and 19 show modeled performance for waveguides emitting at 980 nm, while FIGS. 20 and 21 show modeled performance for waveguides emitting at 915 nm. FIGS. 18 and 20 plot maximum diode laser output power against BPP and FIGS. 19 and 21 plot maximum diode laser brightness against BPP. As can be seen from the plots, the performance of the single flared laser oscillator waveguides is generally superior to conventional BALs across a substantial range of operating powers. Furthermore, all multiple flared laser oscillator waveguides that include two, three, four, or five component flared laser oscillator waveguides exhibit superior performance as compared with conventional BALs, and many single flared laser oscillator waveguides, over an entire operating power range.

Such improvements allow for power-scaling in ways heretofore unachievable in the art of broad area diode lasers. By providing component flared laser oscillator waveguides in close proximity, output power can be scaled without compromising BPP. Conventional BALs are unable to be brought into close proximity to each other for power-scaling since maximum brightness drops as the BPP increases due to non-linear increase in divergence angle for larger emitter width BALs, as can be seen in FIG. 20 and FIG. 22. The drop in brightness at higher BPP for conventional BALs is attributable to a fast rise in slow-axis divergence when the emitter width is increased. Hence, brightness cannot be preserved as a conventional BAL laser BPP increases. Furthermore, a gap is typically required between adjacent conventional BALs in order to index-guide the beams which introduces additional BPP with the increased fill-factor. Component flared laser oscillator waveguides allow a gap between high reflecting back facets while maintaining adjoining or very close front facets. Thermal effects increase for diodes as they are brought close together, but the gap formed between component flared laser oscillator waveguides associated with the flaring of the current injection regions provides a way to mitigate such effects. That is, the lower width of the back facets creates an opportunity to insert gaps between adjacent component flared laser oscillator waveguides (and to tailor the shape of the gaps) that is not possible in conventional BALs without accepting the poorer BAL performance.

In FIGS. 18 and 20, maximum power is plotted against BPP for different laser diodes emitting light at 980 nm and 915 nm wavelengths, respectively. The continuous line for the conventional rectangular BAL demonstrates the increase in BPP (i.e., poorer beam quality) as maximum power increases, which is typically associated with increased emitter width as well as concomitant increase in divergence angle. Also shown are individual points for various single and multiple flared laser oscillator waveguide design configurations with different points representing variation in design features including varying of ratios of partial reflector width to high reflector width. As can be seen from the plots, single flow diode designs have superior maximum power performance across a range of BPPs as compared to BAL designs. The addition of adjacent flared laser oscillator waveguides is shown to deliver substantial improvements over single flared laser oscillator waveguide configurations.

In FIGS. 19 and 21, maximum brightness is plotted against BPP for different laser diodes emitting light at 980 nm and 915 nm, respectively. Conventional BALs are shown with a continuous line as a performance baseline for comparison. As can be seen from the plots, the expected maximum brightness performance for conventional BALs decreases as BPP increases, the increase of the latter typically being associated with increased emitter width as well as concomitant increase in divergence angle. Single flared laser oscillator waveguide performance is shown with several individual points representing various design configurations, including different ratios of partial reflector width to high reflector width. Single flared laser oscillator waveguide configurations exhibit superior maximum brightness performance at about 10 mm-mrad BPP and lower. As can also be seen from the plots, further brightness improvement is provided by multiple flared laser oscillator waveguides, which can be brighter than conventional broad area designs at every BPP.

Figure 14:
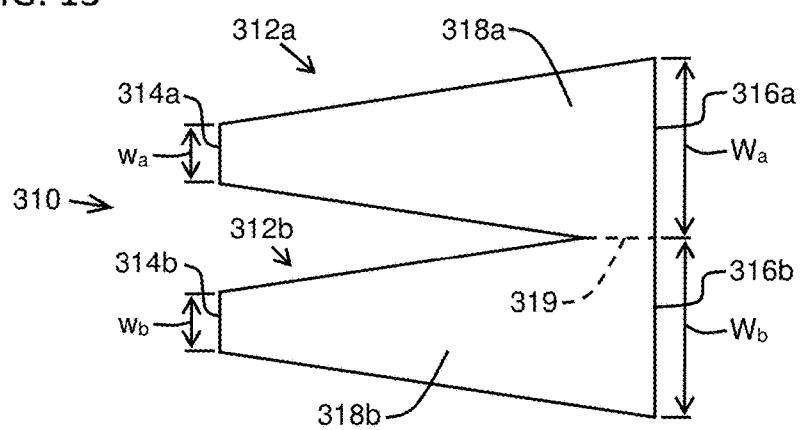
Figure 15:
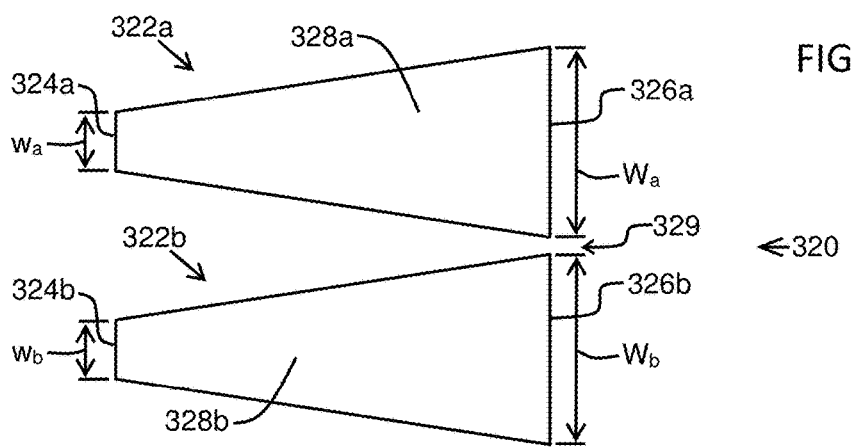

With reference to FIG. 14, there is shown another embodiment of a multiple flared laser oscillator waveguide 310 which includes a pair of component flared laser oscillator waveguides 312a, 312b, each having narrower high reflecting rear facets 314a, 314b and broader partial reflecting facets 316a, 316b so as to form flared current injection regions 318a, 318b therebetween. The component flared laser oscillator waveguides are adjacent such that portions of the respective flared current injection regions 318a, 318b overlap across an adjoining boundary 319. In FIG. 15, an example is shown of a multiple flared laser oscillator waveguide 320 which includes a pair of component flared laser oscillator waveguides 322a, 322b, each having narrower high reflecting rear facets 324a, 324b and broader partial reflecting facets 326a, 326b so as to form flared current injection regions 328a, 328b therebetween. A gap 329 is formed between of the closest portions of the flared current injection regions 328a, 328b, which in this example are situated at the partial reflecting facets 326a, 326b. The gap 329 is relatively small bringing the component flared laser oscillator waveguides in close proximity to each other. Convenient distances are typically on the order of the wavelength of light emitted by the respective lasers. For example, for laser diodes emitting 915 nm or 980 nm light, the distance can be less than a few microns, less than a micron, or in the range of 10 s to 100 s of nm.

Figure 16:
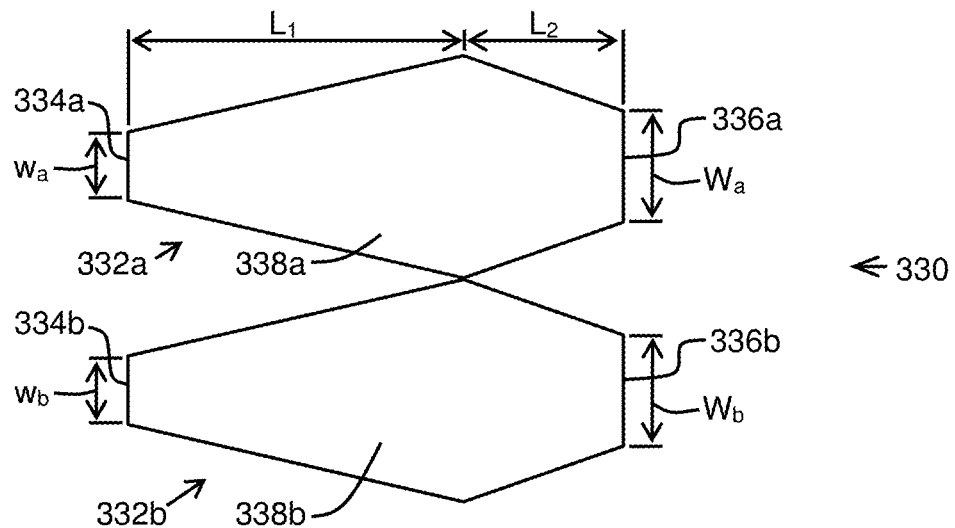

With reference to FIG. 16, there is shown another embodiment of a multiple flared laser oscillator waveguide 330 having a first and second component flared laser oscillator waveguides 332a, 332b. The component waveguides include high reflecting back facets 334a, 334b having widths $w_a$, $w_b$ which are narrower than partial reflecting front facets 336a, 336b having widths $W_a$, $W_b$. The component waveguides also include current injection regions 338a, 338b which flare between the back and front facets such that the maximum width in the flared regions is wider than the front facet widths $W_a$, $W_b$ at a distance $L_1$ from the back facets 334 and $L_2$ from the front facets 336. In some examples, the flared region width at distance $L_1$ can be equal to the partial reflecting front facet width W. As shown, the waveguide 330 has the adjacent current injection regions 338 thereof adjoining at a point. In various examples, regions 338 of adjacent component waveguides 332 can be separated by a gap or can overlap. As the number of constituent component flared laser oscillator waveguides increases, thermal crosstalk may affect beam quality. By bringing adjacent component flared laser oscillator waveguides in contact or in close proximity at a location other than the partial reflectors 336, thermal crosstalk can be minimized while brightness is maximized. Furthermore, waveguide 330 can also allow an optimum near-field width to be selected while BPP remains conserved.

Figure 17:
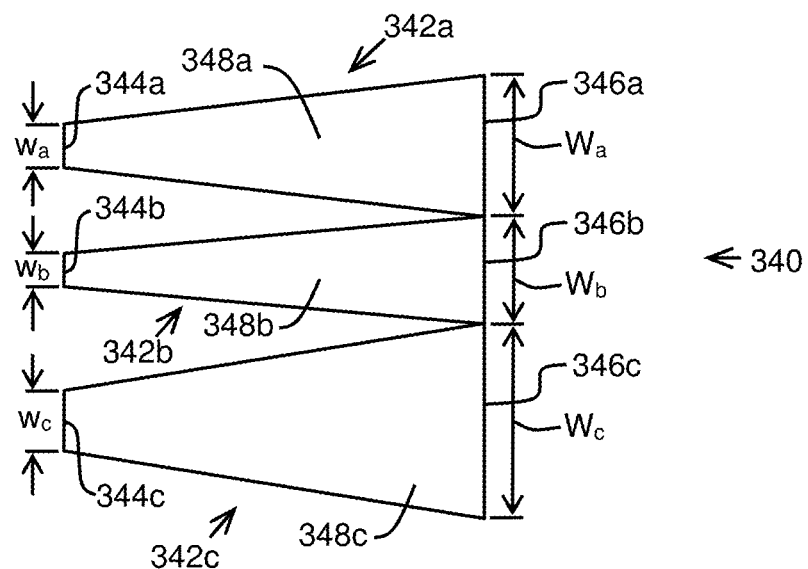

FIG. 17 shows another example of a multiple flared laser oscillator waveguide 340 having first, second, and third component flared laser oscillator waveguides 342a, 342b, 342c. Waveguide 340 includes respective high reflectors 344a, 344b, 344c having widths $w_a$, $w_b$, $w_c$ which are narrower than their corresponding partially reflecting output coupler 346a, 346b, 346c having widths $W_a$, $W_b$, $W_c$. The ratios of widths $W_a/w_a$, $W_b/w_b$, $W_c/w_c$ are each greater than 1 though not necessarily equal to each other. Also, angles between sides of the flared current injection regions and the front or back facets need not be equal or symmetric. In some examples, four or more component flared laser oscillator waveguides may be used. As with previous examples of single flared laser oscillator waveguides, the geometry of the flared injection regions of component flared laser oscillator waveguides need not be linearly shaped, and can include various curved profiles (and combinations of curved profiles) and shapes which can be selected so as to improve output performance. For example, injection regions can flare outward and inward, including to widths narrower than a multimode high reflector width, provided such narrower width remains multimode, and including to widths wider than a partial reflector width. Various other elements, such as gratings or scattering elements, can also be used, as discussed hereinabove with respect to single flared laser oscillator waveguide embodiments.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

What is claimed is:

1. A device, comprising:
a multiple flared oscillator waveguide comprising a plurality of component flared oscillator waveguides adjacently situated along a slow axis to produce a common output beam, each component flared oscillator waveguide including a multimode high reflector facet, a partial reflector facet spaced apart from the high reflector facet, and a flared current injection region extending between the multimode high reflector facet and the partial reflector facet, wherein the ratio of a partial reflector facet width to a high reflector facet width is n:1, where n>1;
wherein the component flared oscillator waveguides are arranged such that portions of the flared current injection regions overlap, adjoin, or are spaced apart from each other by a gap that is on the order of the wavelength of light emitted by the component flared oscillator waveguides such that the gap is less than ten microns.

2. The device of claim 1, further comprising one or more additional multiple flared oscillator waveguides;
wherein the multiple flared oscillator waveguide and the one or more additional multiple flared oscillator waveguides are spaced apart from each other in a bar configuration having an array pitch spacing that is larger than the order of the wavelength of light emitted by the component flared oscillator waveguides so that each of the multiple flared oscillator waveguides defines a separate emitter source of the bar configuration.

3. The device of claim 1, wherein the common output beam emitted from the partial reflectors of the component flared oscillator waveguides has a larger brightness for the same beam parameter product as compared to a single flared oscillator waveguide having a partial reflector width equal to the total of the component flared oscillator waveguide partial reflector widths and a high reflector width equal to the total of the component flared oscillator waveguide high reflector widths.

4. The device of claim 1, wherein the multiple flared oscillator waveguide is index-guided or gain-guided or a combination of index-guided and gain-guided.

5. The device of claim 1, wherein the width of the component flared oscillator waveguide high reflectors is selected to be in the range of about 5 μm to 100 μm.

6. The device of claim 1, wherein the widths of adjacent component flared oscillator waveguide high reflectors are different from each other.

7. The device of claim 1, wherein the widths of adjacent component flared oscillator waveguide partial reflectors are different from each other.

8. The device of claim 1, wherein the flared current injection region of at least one of the component flared oscillator waveguides has a maximum width larger than the partial reflector width of the at least one component flared oscillator waveguide.

9. The device of claim 1, wherein different component flared oscillator waveguides of the multiple flared oscillator waveguide emit light at different selected wavelengths.

10. The device of claim 1, wherein a shape of a component flared oscillator flared current injection region is not identical to an adjacent component flared oscillator waveguide flared current injection region.

11. The device of claim 1, wherein the maximum brightness and maximum output power of the common output beam are larger across a selected BPP range for the multiple flared oscillator waveguide as compared to a diode laser having the same partial reflector width and a high reflector width equal to the partial reflector width.

12. The device of claim 1, wherein the component flared oscillator waveguides include end portions positioned at the multimode high reflector facets and/or partial reflector facets allowing a cleave to be formed in the end portions providing a predictable width for the multimode high reflector facets or partial reflector facets.

13. The device of claim 1, wherein the flared current injection regions include one or more flares each with a constant change in width with respect to length.

14. The device of claim 1, wherein the flared current injection regions one or more flares each with a variable change in width with respect to length.

15. The device of claim 1, further comprising a distributed feedback grating disposed in at least one of the flared current injection regions and extending between the corresponding facets, the distributed feedback grating providing wavelength stabilization to the device.

16. The device of claim 1, further comprising distributed Bragg reflector gratings positioned at the high reflector facets, the distributed Bragg reflectors providing wavelength stabilization to the device.

17. The device of claim 1, further comprising one or more scattering elements disposed along one or opposing lateral sides of the flared current injection regions, the scattering elements operable to scatter higher order modes of light propagating therein.

18. The device of claim 1, wherein the flared current injection regions propagate light such that respective sub-beams of the common output beam emitted at the respective partial reflector facets have a narrower beam width than the respective partial reflector facet widths.

19. The device of claim 18, wherein the narrower beam width and a total pumping area of the respective flared current injection region associated with the ratio n:1 reduce a thermal resistance and electrical series resistance and increase a beam brightness and/or reduce a slow axis beam parameter product of the respective subbeam at a selected power of the common output beam.

20. An apparatus, comprising:
a plurality of semiconductor gain volumes, each having a multimode high reflector and an output coupler oppositely spaced apart by a resonator length, top and bottom opposing sides spaced apart by a resonator height, and first and second opposing flared sides spaced apart by a variable resonator width providing the multimode high reflector with a shorter width than the output coupler;
wherein the gain volumes are adjacently situated along a slow axis to emit a common output beam such that respective sides overlap, adjoin, or are separated by a gap that is less than ten microns.

21. A multiple flared laser oscillator waveguide comprising:
a plurality of semiconductor gain volumes arranged so as to overlap, to adjoin, or to be separated by a gap along a slow axis that is less than ten microns so as to emit a common beam, each semiconductor gain volume including:
a high reflector surface and an opposing partial reflector surface spaced apart from each other by a resonator length; and
first and second opposite side surfaces spaced apart by a resonator width wherein at least a portion of the opposite side surfaces are spaced apart by a variable resonator width forming a flared oscillator region and providing the high reflector surface with a shorter width than the partial reflector surface.

22. The device of claim 1, wherein the portions of the flared current injection regions adjoin at a point.

23. The device of claim 1, wherein the portions of the flared current injection regions adjoin to form an adjoining boundary having a length.

24. The apparatus of claim 20, wherein the adjacent semiconductor gain volumes adjoin at a location spaced apart from the respective partial reflectors and do not adjoin at the respective partial reflectors.

25. The apparatus of claim 20, wherein the semiconductor gain volumes adjoin to form an adjoining boundary.

26. The multiple flared laser oscillator waveguide of claim 21, wherein the first side surface of one of the semiconductor gain volumes adjoins the second surface of another one of the semiconductor gain volumes to form an adjoining boundary.

* * * * *